United States Patent
Wagner et al.

(10) Patent No.: US 11,744,158 B2
(45) Date of Patent: Aug. 29, 2023

(54) FERROELECTRIC MATERIAL, MEMS COMPONENT COMPRISING A FERROELECTRIC MATERIAL, MEMS DEVICE COMPRISING A FIRST MEMS COMPONENT, METHOD OF PRODUCING A MEMS COMPONENT, AND METHOD OF PRODUCING A CMOS-COMPATIBLE MEMS COMPONENT

(71) Applicants: Fraunhofer-Gesellschaft zur Foerderung der angewandten Forschung e.V., Munich (DE); Christian-Albrechts-Universitaet zu Kiel, Kiel (DE)

(72) Inventors: Bernhard Wagner, Itzehoe (DE); Fabian Lofink, Itzehoe (DE); Dirk Kaden, Itzehoe (DE); Simon Fichtner, Itzehoe (DE)

(73) Assignees: Fraunhofer-Gesellschaft zur Foerderung der angewandten Forschung e.V., Munich (DE); Christian-Albrechts-Universitaet zu Kiel, Kiel (DE)

(*) Notice: Subject to any disclaimer, the term of this patent is extended or adjusted under 35 U.S.C. 154(b) by 436 days.

(21) Appl. No.: 17/016,941

(22) Filed: Sep. 10, 2020

(65) Prior Publication Data
US 2020/0411747 A1    Dec. 31, 2020

Related U.S. Application Data

(63) Continuation of application No. PCT/EP2019/056275, filed on Mar. 13, 2019.

(30) Foreign Application Priority Data

Mar. 13, 2018  (DE) .......................... 102018203812.0

(51) Int. Cl.
 *H01L 41/187*   (2006.01)
 *H10N 30/853*   (2023.01)
 (Continued)

(52) U.S. Cl.
 CPC ............. *H10N 30/853* (2023.02); *B81B 7/02* (2013.01); *H10N 30/045* (2023.02);
 (Continued)

(58) Field of Classification Search
 CPC ............. H10N 30/853; H10N 30/1051; H10N 30/2042; H10N 30/50
 See application file for complete search history.

(56) References Cited

U.S. PATENT DOCUMENTS 5,644,184 A  7/1997  Kucherov
7,758,979 B2  7/2010  Akiyama et al.
(Continued)

FOREIGN PATENT DOCUMENTS

CN   1211353 A       3/1999
DE   102008025691 A1 12/2008
(Continued)

OTHER PUBLICATIONS

"(Abstract). Dissertation", Universität Halle, May 26, 2005. Kapitel 1.1.1 und 1.1.2., https://sundoc.bibliothek.uni-halle.de/diss-online/05/05H077/t2.pdf.
(Continued)

*Primary Examiner* — Bryan P Gordon
(74) *Attorney, Agent, or Firm* — Perkins Coie LLP; Michael A. Glenn

(57) ABSTRACT

A ferroelectric material includes a mixed crystal having AlN and at least one nitride of a transition metal. The proportion of the nitride of the transition metal is selected such that a direction of an initial or spontaneous polarity of the ferroelectric material is switchable by applying a switchover
(Continued)

voltage. The switchover voltage is below a breakdown voltage of the ferroelectric material.

18 Claims, 18 Drawing Sheets

(51) Int. Cl.
    *B81B 7/02*     (2006.01)
    *H10N 30/045*     (2023.01)
    *H10N 30/50*     (2023.01)
    *H10N 30/00*     (2023.01)
    *H10N 30/20*     (2023.01)

(52) U.S. Cl.
    CPC ..... *H10N 30/1051* (2023.02); *H10N 30/2042* (2023.02); *H10N 30/50* (2023.02); *B81B 2201/03* (2013.01)

(56) References Cited

U.S. PATENT DOCUMENTS

| | | | |
|---|---|---|---|
| 2002/0064001 A1* | 5/2002 | Shiraishi | G11B 5/5552 |
| 2008/0289952 A1 | 11/2008 | Pelrine et al. | |
| 2008/0296529 A1 | 12/2008 | Akiyama et al. | |
| 2011/0120843 A1* | 5/2011 | Wunnicke | H01H 57/00 200/181 |
| 2013/0026021 A1* | 1/2013 | Hori | H01H 49/00 29/25.35 |
| 2013/0049544 A1* | 2/2013 | Yokoyama | H10N 30/853 310/365 |
| 2016/0304340 A1 | 10/2016 | Meyer et al. | |
| 2017/0006381 A1 | 1/2017 | Rusconi Clerici et al. | |
| 2017/0263847 A1 | 9/2017 | Daoust et al. | |
| 2018/0249252 A1 | 8/2018 | Clerici et al. | |

FOREIGN PATENT DOCUMENTS

| | | |
|---|---|---|
| DE | 102013114826 A1 | 6/2015 |
| DE | 102015213714 A1 | 1/2017 |
| DE | 102015116640 A1 | 4/2017 |
| EP | 3216894 A1 | 9/2017 |
| JP | 2007534283 A | 11/2007 |
| JP | 2009010926 A | 1/2009 |
| JP | 2013148562 A | 8/2013 |
| JP | 2017051005 A | 3/2017 |
| JP | 2018026445 A | 2/2018 |
| WO | 0245181 A1 | 6/2002 |
| WO | 2009153757 A1 | 12/2009 |
| WO | 2017065691 A1 | 4/2017 |

OTHER PUBLICATIONS

Akiyama, Morito, et al., "Influence of oxygen concentration in sputtering gas on piezoelectric response of aluminum nitride thin films", Appl. Phys. Lett., vol. 93, No. 2, pp. 6-9, 2008, pp. 6-9.
Fichtner, Simon, et al., "Stress controlled pulsed direct current co-sputtered Al1—xScxN as piezoelectric phase for micromechanical sensor applications", APL Mater., vol. 3, No. 11, 2015.
Harris, N R, et al., "A multilayer thick-film PZT actuator for MEMs applications", Sensors Actuators, A Phys., vol. 132, No. 1 Spec. Iss., pp. 311-316, 2006, 2006, pp. 311-316.
Iborra, Enrique, et al., "Piezoelectric and electroacoustic properties of Ti-doped AlN thin films as a function of Ti content", IEEE Int. Ultrason. Symp. /US, pp. 2734-2737, 2012, pp. 2734-2737.
Lu, Yipeng, et al., "A High Fill-Factor Annular Array of High Frequency Piezoelectric Micromachined Ultrasonic Transducers", J. Microelectromechanical Syst., vol. 24, No. 4, pp. 904-913, 2015., pp. 904-913.
Mayrhofer, P M, et al., "Microstructure and piezoelectric response of YxAl1—xN thin films", Acta Materialia, vol. 100, pp. 81-89, 2015, 2015, pp. 81-89.
Milyutin, E, et al., "Sputtering of (001)AlN thin films: Control of polarity by a seed layer", J. Vac. Sci. Technol. B Microelectron. Nanom. Struct., vol. 28, No. May, p. L61, 2010, pp. L61.
Sanchez, Luz M, et al., "Texture control in lead zirconate titanate multilayer thin films", IEEE Trans. Ultrason. Ferroelectr. Freq. Control, vol. 61, No. 4, pp. 654-661, 2014, 2014, pp. 654-661.
Sinha, Nipun, et al., "Piezoelectric aluminum nitride nanoelectromechanical actuators", Appl. Phys. Lett., vol. 95, No. 5, 2009.
Zhang, Siyuan, et al., "Tunable optoelectronic and ferroelectric properties in Sc-based III-nitrides", J. Appl. Phys., vol. 114, No. 13, 2013.
Zukauskaite, Agne, et al., "YxAl1—xN thin films", J. Phys. D. Appl. Phys., vol. 45, No. 42, p. 422001, 2012, pp. 422001.
Akiyama, M, et al., "Enhancement of piezoelectric response in scandium aluminum nitride alloy thin films prepared by dual reactive cosputtering", Morito Akiyama, Toshihiro Kamohara, Kazuhiko Kano, Akihiko Teshigahara, Yukihiro Takeuchi, and Nobuaki Kawahara, "Enhancement of piezoelectric response in scandium aluminum nitride alloy thin films prepared by dual reactive cosputtering," Adv. Mater., vol. 21, No. 5, pp. 593-596, 2009, pp. 593-596.
Ballas, R G, "Piezoelectric Multilayer Beam Bending Actuators", R. G. Ballas, "Piezoelectric Multilayer Beam Bending Actuators, Static and Dynamic Behavior and Aspects of Sensor Integration", Springer, 2007, 397 pp., 2007.
Felmetsger, V V, et al., "Reactive sputtering of highly c-axis textured Ti-doped AlN thin films", V. V. Felmetsger and M. K. Mikhov, "Reactive sputtering of highly c-axis textured Ti-doped AlN thin films," IEEE Int. Ultrason. Symp. /US, pp. 782-785, 2012, 2012, pp. 782-785.
Fichtner, Simon, et al., "Identifying and overcoming the interface originating c-axis instability in highly Sc enhanced AlN for piezoelectric micro-electromechanical systems", S. Fichtner et al., "Identifying and overcoming the interface originating c-axis instability in highly Sc enhanced AlN for piezoelectric micro-electromechanical systems," J. Appl. Phys., vol. 122, No. 3, p. 35301, 2017, 8 pp.
Ikeda, Takuro, "Fundamentals of Piezoelectricity", Takuro Ikeda, "Fundamentals of Piezoelectricity", pp. 14-17, Oxford University Press, 1990., pp. 14-17.
Mizuno, Takaaki, et al., "Germanium aluminum nitride thin films for piezo-MEMS devices", Mizuno, Takaaki et al. "Germanium aluminum nitride thin films for piezo-MEMS devices." 2017 19th International Conference on Solid-State Sensors, Actuators and Microsystems (Transducers) (2017): pp. 1891-1894, pp. 1891-1894.
Randall, C.A., et al., "High Strain Piezoelectric Multilayer Actuators: A Material Science and Engineering Challenge", C. Randall, A. Kelnberger, G. Y. Yang, R. E. Eitel, and T. R. Shrout, "High Strain Piezoelectric Multilayer Actuators: A Material Science and Engineering Challenge," J. Electroceramics, vol. 14, No. 3, pp. 177-191, 2005., pp. 177-191.

* cited by examiner

FERROELECTRIC MATERIAL, MEMS COMPONENT COMPRISING A FERROELECTRIC MATERIAL, MEMS DEVICE COMPRISING A FIRST MEMS COMPONENT, METHOD OF PRODUCING A MEMS COMPONENT, AND METHOD OF PRODUCING A CMOS-COMPATIBLE MEMS COMPONENT

CROSS-REFERENCES TO RELATED APPLICATIONS

This application is a continuation of copending International Application No. PCT/EP2019/056275, filed Mar. 13, 2019, which is incorporated herein by reference in its entirety, and additionally claims priority from German Application No. DE 10 2018 203 812.0, filed Mar. 13, 2018, which is incorporated herein by reference in its entirety.

Embodiments according to the invention relate to a ferroelectric material, a MEMS component comprising a ferroelectric material, a MEMS device comprising a first MEMS component, a method of producing a MEMS component, and a method of producing a CMOS-compatible MEMS component.

BACKGROUND OF THE INVENTION

Piezoelectric MEMS actuators offer significantly higher forces, for example compared to electrostatically driven components. Nevertheless, also these forces are often insufficient, especially for non-resonant movements. However, by means of piezoelectric multilayers, it is theoretically possible to couple forces of any magnitudes into the respective components. However, the piezoelectrics available to date, such as lead zirconate titanate (PZT) or aluminum nitride (AlN), for example, are suitable for piezoelectric MEMS multilayer systems to a limited extent only, so that the transfer to commercial use of corresponding components is not yet promising.

Ferroelectric materials are a variant of piezoelectric materials that is characterized by a spatially rotatable electrical polarization P, the direction of which may be determined by an external electrical field E. Depending on the orientation of the polarization relative to the electric field that is effective, the material also expands or contracts (piezoelectric effect). This effect may be used in actuators. In microsystem technology, for example, a plate capacitor with a ferroelectric dielectric is deposited and structured (patterned) on a passive layer. The passive layer may be the membrane of an ultrasonic transducer or that of a loudspeaker. As a result of the transverse contraction or expansion of the ferroelectric material when an electrical voltage U is applied, a compressive or tensile stress is generated within the substrate, depending on the direction of polarization, and the substrate is thus deformed. The mechanical force underlying the deformation is caused by the piezoelectric coefficients of the material, its polarization direction and the electrical voltage that is available [1].

One possibility to increase the force for a fixed electrical voltage is to use a multilayer system. When using n-layers of piezoelectric material with piezoelectric coefficients that are identical in amount, above which the available electric voltage is applied, the resulting force may be increased by up to a factor n [2]. The actually achievable force depends on the respective orientation of the material polarization relative to the applied electric field. Ideally, the electric field and the polarization in all piezoelectric layers are aligned, on the same side of the neutral plane (also referred to as a neutral fiber) of the layer system, to be either parallel or anti-parallel to each other. In this case, all layers contribute, in a unidirectional manner, to the total force, which thus is at a maximum.

Macroscopic ferroelectric multilayer actuators are already being used industrially in fuel injection pumps, for example [3]. In microsystem actuators, ferroelectric multilayer systems, despite their obvious advantages, have so far only been investigated by academia (e.g. [4], [5]). This is because even integration of a ferroelectric single layer (usually made of PZT) into MEMS production is a challenge that may be mastered only with great technological effort—for example, with regard to diffusion, temperature budget and structuring of the material. Even if integration of multilayer PZT into MEMS technology were available in the future, the material would still not be CMOS-compatible and not suitable for electrically bipolar actuation, among other disadvantages.

Despite significantly lower piezoelectric coefficients, non-ferroelectric materials such as AlN are therefore sometimes looked into for being applied in piezoelectric actuators (e.g. [6], [7], [20], [21], [22], [23]). AlN is a pyroelectric material, i.e., like ferroelectrics, it exhibits spontaneous electrical polarization. Unlike ferroelectric materials, however, polarization in AlN cannot be rotated spatially by an external electric field. For applying the material in piezoelectric multilayers, however, this means additional production costs that are difficult to justify and are due to the need for additional insulating layers and electrodes. Alternatively, theoretically there is the possibility of one-off adjustment of material polarization. Methods for this do exist in a rudimentary form, but here, too, there is a significant additional manufacturing effort involved, e.g. due to the usefulness of additional deposition processes.

In the following, said previous approaches to solutions which have been briefly introduced will be discussed in more detail, and finally, the extent to which the development of ferroelectric mixed crystals based on AlN and the nitrides of transition metals will enable piezoelectric multilayer components without having to accept the disadvantages of classic ferroelectrics or pyroelectrics will be explained. In [24] and [25], AlScN mixed crystals for improving piezoelectric properties have already been described, but they provide no indication of how a ferroelectric mixed crystal may be produced by means of scandium.

A further conceivable application of ferroelectric multilayers is a charge amplification that is intrinsic in components, as is important for sensor concepts which piezoelectrically convert their input variable into electric charges (as an alternative to conversion into electric voltages). Thus, the requirements placed upon an external charge amplifier may be reduced. Such charge amplification may also be advantageous in micro generators. The approaches for actuators which will be presented in the following may also be directly applied to the charge amplification mentioned above. The dualism of the two concepts reflects the two directions of the piezoelectric effect (direct and inverse).

For implementing piezoelectric multilayer systems for actuators in microsystems technology, four general approaches are conceivable, which differ in essential aspects. The aim is to apply the maximum available electric field strength (=UE/thickness of a single layer) over each individual layer and to have all layers on the same side of the neutral plane contribute to the force with the same sign. The previous approaches to solutions that will be presented in the following result directly from considerations made in [2], for example.

For piezoelectric sensors and generators there is the possibility of voltage amplification by connecting several identical piezoelectric capacitor structures in series or by increasing the layer thickness of the piezoelectric. However, this approach would have no direct advantage for measuring concepts that read out the output signal of a sensor by means of a charge amplifier. In the same way as a series connection provides for component-intrinsic voltage amplification, intrinsic charge amplification may be implemented by means of piezoelectric capacitors connected in parallel, however. In order to implement this in a multilayer system, however, the approaches presented in the following would have to be applied, with their respective disadvantages. The aim here is to avoid charge compensation between adjacent capacitors. This in turn makes demands on the polarization direction of the piezoelectric material.

Classical ferroelectrics such as PZT, for example, may be combined to form effective multilayer actuators without any additional insulating layers, since this class of materials exhibits inherent alignment of its electrical polarization along the field direction of external electrical fields. In addition to the possibility of providing both sides of a passive layer with active piezoelectric layers, it may be advantageous for the sake of simplicity to coat it only on one side or to design the structure exclusively on the basis of a piezoelectric multilayer together with electrodes, i.e. without a passive layer. In either case, the position of the neutral plane may be taken into account when selecting suitable polarization. Layers above this plane may each couple their force in with the opposite sign, as is the case for layers located below, it if a bending movement is to be induced.

Despite this design which is as simple as possible, the ferroelectrics which have been used in microsystems technology up to now, which are essentially PZT-based, have some decisive disadvantages:

Useful deposition temperatures of more than 500° C. and the lead contained make the material incompatible with CMOS production.

The risk of electrical breakdowns limits the maximum usable electric field strength and, thus, the resulting force.

The relationship between force and applied electric field is highly non-linear around the zero point of the field. The force or strain also has the same sign over long distances. In order to guarantee, in an approximation, harmonious oscillation of the driving force, a voltage offset may be used. In conjunction with a low breakdown field strength, this further limits the maximum available amplitude of the driving force.

The intrinsic mechanical stress of the ferroelectric layers may be influenced to a limited extent only.

The dielectric losses and the leakage currents occurring during operation are significantly higher than in some other dielectrics, such as AlN.

Purely pyroelectric, i.e. explicitly non-ferroelectric materials such as pure AlN may be deposited in a CMOS-compatible manner. They may be produced in such a way that the electric breakdown field strength reaches significantly higher values than in classical ferroelectrics and that, in addition, only small electrical losses are involved. In addition, the relationship between the electric field and the resulting force is linear in good approximation. In particular, this allows efficient excitation with bipolar electric voltages. However, since polarisation cannot be changed afterwards, it is defined only during production of the material. In multilayer systems produced by one and the same process, polarization of all layers points in the same direction, ideally perpendicular to the substrate. In order to ensure an effective drive, the exciting electric field may therefore also point in the same direction for all individual layers. Therefore, one may electrically separate the individual capacitor structures of the multilayers. The main disadvantage of this compared to the use of ferroelectrics is the need for at least two additional layers, namely an insulator and a further electrode, per piezoelectric layer. Their deposition and structuring signifies considerablly higher production effort. The omission of a corresponding insulating layer or a possible short circuit across the insulating layer would result in complete component failure. In principle, this approach may also be used to produce passive layers actively coated on both sides or layer systems without a passive layer.

A bimorph enables using a non-ferroelectric double layer without any additional electrical insulation. A prerequisite for an efficient drive is that the two piezoelectric layers are located on opposite sides of the neutral plane of the actuator. The layers may share an electrode layer or be spatially separated by an intermediate passive layer. The number of piezoelectric layers is limited to n=2.

Polarization in non-ferroelectric pyroelectrics, such as AlN, is permanently imprinted during the manufacture of the material. Optimum piezoelectric behavior is achieved when electrical polarization is aligned exclusively perpendicularly to the substrate. The need for an insulating layer between the individual capacitor units of a multilayer is eliminated if layers with mutually antiparallel polarization may be alternately produced and used. An irreversible adjustment, which may be used for this purpose, of the polarization could be achieved by providing a suitable intermediate or starting layer [8]. Furthermore, it has been shown that doping, e.g. with oxygen or germanium [9, 10], also allows the polarization direction to be adjusted. However, these approaches are still far from being ready for application. In addition, for optimum functioning it may be ensured that a complete polarization inversion is achieved, since this cannot be adjusted subsequently. The resulting complexity as well as the importance of developing additional processes for multilayer systems may be seen as a major disadvantage to this approach. In contrast to PZT, however, the spatial orientation of the polarization remains constant, even at high electric field strengths.

In view of this, there is a need for a concept that offers an improved compromise between a higher resulting force, minimization of the number of insulating layers and electrode layers that may be used, and a reduction of the processes that may be used for depositing piezoelectric layers of a multilayer while enabling CMOS compatibility and a linear connection between electric voltage and the resulting force.

SUMMARY

According to an embodiment, a ferroelectric material may have: a mixed crystal including AlN and at least one nitride of a transition metal; wherein the proportion of the nitride of the transition metal is selected such that a direction of an initial or spontaneous polarity of the ferroelectric material is switchable by applying a switchover voltage, the switchover voltage being below a breakdown voltage of the ferroelectric material.

According to another embodiment, a method may have the steps of: providing a mixed crystal having an initial or spontaneous polarity, wherein the mixed crystal includes AlN and at least one nitride of a transition metal, wherein the proportion of the nitride of the transition metal is selected such that a direction of the initial or spontaneous polarity of the ferroelectric material is switchable by applying a switchover voltage, the switchover voltage being below a breakdown voltage of the ferroelectric material; and applying a switchover voltage to the mixed crystal, so that the direction of the initial or spontaneous polarity of the mixed crystal is reversed.

According to another embodiment, a MEMS component may have an inventive ferroelectric material.

According to another embodiment, a MEMS device may have: a substrate, and a first MEMS component as claimed in claim 12, wherein the passive layer of the MEMS component is deflectably disposed on the substrate.

According to yet another embodiment, a method of producing a MEMS component may have the step of: stacking a first electrode, a first ferroelectric layer, a second electrode, a second piezoelectric layer and a third electrode in this order, wherein the first ferroelectric layer and the second piezoelectric layer have the same direction of polarization and wherein at least the first ferroelectric layer includes a ferroelectric material which may have: a mixed crystal including AlN and at least one nitride of a transition metal; wherein the proportion of the nitride of the transition metal is selected such that a direction of a polarity of the ferroelectric material is switchable by applying a switchover voltage, the switchover voltage being below a breakdown voltage of the ferroelectric material; and which method further may have the step of: applying a switchover voltage to the first electrode and to the second electrode, wherein the polarization direction of the first ferroelectric layer is reversed, so that the polarization direction of the first ferroelectric layer is reversed.

In the following, ferroelectric layers will also be referred to as piezoelectric layers. However, the layers according to the embodiments do not necessarily all have to be ferroelectric—it is sufficient, for example, if some of the piezoelectric layers (e.g. every other layer) contain a ferroelectric material and all others contain only a piezoelectric material. It is conceivable, for example, that some of the layers have a deviating TM proportion or a deviating mechanical stress, and are therefore not ferroelectric.

One embodiment concerns a ferroelectric material comprising a mixed crystal comprising AlN and at least one nitride of a transition metal. The proportion of the nitride of the transition metal may be increased until a direction of an initial or spontaneous polarity of the ferroelectric material may be switched by applying a switchover voltage and until the switchover voltage is below a breakdown voltage of the ferroelectric material. In other words, the proportion of the nitride of the transition metal may be increased until a direction of an initial or spontaneous polarity of the ferroelectric material may be switched by applying a switchover voltage and until the switchover voltage is below a breakdown voltage of the ferroelectric material.

This embodiment of the ferroelectric material comprising a mixed crystal is based on the finding that an increase in the proportion of the nitride of the transition metal in the mixed crystal of the ferroelectric material results in that the initial or spontaneous polarity of the ferroelectric material may be switched by applying a switchover voltage, and that, thus, the direction of the initial or spontaneous polarity of the ferroelectric material is not determined by the manufacturing process, but may be changed subsequently. For example, the mixed crystal initially has an initial or spontaneous polarity, the direction of which may be changed by applying a switchover voltage. For example, the direction of the polarity may be rotated by 180°, or a direction of an initial polarity may be aligned in parallel with an electric field caused by the switchover voltage.

If the ferroelectric material is used in a multilayer system, the ferroelectric layers of the multilayer may be deposited in a single process, for example, since there is no need for in situ manipulation of the polarization direction. Instead, all ferroelectric layers may initially be deposited with the same polarization, and the respective polarization of individual selected ferroelectric layers may be subsequently switched by applying a switchover voltage. The possibility of switching the polarity of the ferroelectric material by applying a switchover voltage after the manufacturing process minimizes the number of insulating layers and electrode layers that may be used in a multilayer system of the ferroelectric material, since polarization of the individual layers of the ferroelectric material may be adjusted, with the aid of a switchover voltage, in such a way that, for example, two layers of the ferroelectric material need to have only one electrode layer between them, which is shared by both layers having the ferroelectric material.

Thus, it may be stated that the ferroelectric material, when used in a multilayer system, may lead to the fact that the ferroelectric layers of the multilayer may be deposited in a single process and that the number of insulating layers and electrode layers that may be used may be minimized by switching the polarity of individual ferroelectric layers.

In one embodiment, the ferroelectric material exhibits mechanical stress. The mechanical stress may be adjusted, for example, by the composition of a gas used during manufacture or by applying an electrical voltage during manufacture. The mechanical stress lies between a first value of a compressive stress and a second value of a tensile stress, an absolute value of the first value being lower than an absolute value of the second value. This means, for example, that the mechanical stress within a ferroelectric layer comprising the ferroelectric material is adjusted toward more tensile stress or less compressive stress so that the switchover voltage is below the breakdown voltage of the ferroelectric material. The TM proportion (transition-metal proportion) and the mechanical stress may be adjusted independently of each other over long distances—but both have an influence on the amount of the switchover voltage. Due to the interaction between the TM proportion and the mechanical stress, e.g. for an increase of the tensile stress of ferroelectric layers comprising the ferroelectric material, the useful proportion of nitride of the transition metal decreases, and in case of an increase of the compressive stress, e.g., the useful proportion of nitride of the transition metal may increase.

In an embodiment, the mechanical stress is within an interval from −600 MPa (first value of compressive stress) to 2000 MPa (second value of tensile stress), negative values signifying compressive stress and positive values signifying tensile stress. If the mechanical stress lies in the interval from −600 MPa to 2000 MPa, such as within an interval from −550 MPa to 1500 MPa, from −500 MPa to 1000 MPa or from −450 MPa to 900 MPa, then, provided that the TM proportion (the proportion of the transition metal) exceeds a certain limit, for example, one achieves that the switchover voltage is below the breakdown voltage and that, thus, the ferroelectric material is not damaged when the switchover voltage is applied. For example, the range from −600 MPa to 2000 MPa covers the range where the ratio of compressive stress to tensile stress is optimized so that the direction of polarity of the ferroelectric material is switched when a switchover voltage is applied.

In an embodiment, the direction of polarity of the ferroelectric material is maintained for a long period of time after the applied switchover voltage is removed. This means, for example, that after this change in the direction of polarity of the ferroelectric material, the direction of polarization remains constant for a long time. If the original direction of polarization of the ferroelectric material, prior to application of the switchover voltage, is desired, the switchover voltage will have to be applied once again to the ferroelectric material, however with the opposite electric field to that of the previous switchover voltage. The direction of polarity of the ferroelectric material aligns itself along the electric field which penetrates the ferroelectric material and is caused by the switchover voltage.

In an embodiment, the selected proportion of the nitride of the transition metal causes the mixed crystal to become ferroelectric. Due to the ferroelectric property of the mixed crystal, the polarity of the mixed crystal, among other things, may be switched electrically, for example by applying a switchover voltage. Switching the polarity means, for example, that the polarity of the mixed crystal points in one direction within the mixed crystal before a switchover voltage is applied and that, after a switchover voltage is applied, the polarity of the mixed crystal points in the direction opposite to the polarization direction before the switchover voltage is applied. Thus, the polarity is inverted, for example. However, switching the polarity of the ferroelectric material may also mean that, for example, a large proportion of dipole moments of the mixed crystal (e.g. between 50% and 100% of the dipoles, between 70% and 100% of the dipoles or between 80% and 100% of the dipoles, such as 90% of the dipoles) is oriented along an electric field direction, generated by applying a switchover voltage to the mixed crystal; before applying the switchover voltage to the mixed crystal, a large part of the dipole moments of the mixed crystal was oriented in the opposite direction with respect to the field direction of the subsequently applied switchover voltage.

In an embodiment, the ratio of a number of transition metal atoms to a sum of the number of transition metal atoms and a number of aluminum atoms lies within a range ≥0.2 and ≤0.5. For example, the ratio of the number of transition metal atoms to the sum of the number of transition metal atoms and the number of aluminum atoms may be within a range between 0.25 and 0.43 or 0.30 and 0.36, such as 0.36, for example. The ratio depends, for example, on the transition metal. However, the ratio may also depend on the mechanical stress of the ferroelectric material. For example, for layers of the ferroelectric material that are under tensile stress, the useful proportion of the nitride of the transition metal would be reduced, in the case of compressive stress it would be increased. In addition, the ferroelectric material may be deposited at temperatures below 500° C. (for example, at a temperature between 0° C. and 500° C., such as 200° C., 240° C., 300° C., 360° C., 400° C. or 470° C.) and, among other things, in a lead-free manner, which makes it CMOS-compatible.

In an embodiment, the transition metal includes scandium, yttrium, titanium, chromium, niobium or any combination of these. With the aid of these specific transition metals, for example, it is possible to switch the polarity of the ferroelectric material by applying a switchover voltage to the mixed crystal.

An embodiment refers to a process involving the step of providing a mixed crystal exhibiting initial or spontaneous polarity. The mixed crystal comprises AlN and at least one nitride of a transition metal. The proportion of the nitride of the transition metal is selected, for example, such that a direction of the initial or spontaneous polarity of the ferroelectric material is switchable by applying a switchover voltage. The switchover voltage is, for example, below a breakdown voltage of the ferroelectric material. The method further comprises the step of applying a switchover voltage to the mixed crystal so that the direction of the initial or spontaneous polarity of the mixed crystal is reversed.

One embodiment refers to a MEMS component comprising a ferroelectric material. By using the ferroelectric material, e.g. according to one of the embodiments, a wide variety of MEMS components may be manufactured in which the property of the ferroelectric material, namely that the polarity may be switched by applying a switchover voltage, may be utilized.

Furthermore, the fabrication of MEMS components, for example consisting of several layers of the ferroelectric material, is simplified by the ferroelectric material, since all layers may be fabricated by using the same process and since, subsequently, the polarity of individual layers may be switched, or the polarities of several layers may be switched simultaneously or successively, by applying a switchover voltage.

In an embodiment, the MEMS component comprises a first ferroelectric layer comprising the ferroelectric material, a first electrode disposed on a first surface of the first ferroelectric layer, and a second electrode disposed on a second surface of the first ferroelectric layer. The second surface is opposite the first surface, for example. This is an example of a multilayer system made of the ferroelectric material. A switchover voltage may be applied to the first ferroelectric layer via the first electrode and the second electrode. By applying a switchover voltage, the polarity of the first ferroelectric layer may be switched. If this MEMS component is operated at a voltage lower than the switchover voltage, the direction of the polarity of the first ferroelectric layer will not change. If the MEMS component is operated at a voltage lower than the switchover voltage, it may, for example, have the function of an actuator and, for example, convert the supplied electric current to mechanical movement by applying the voltage to the first and second electrodes and, for example, shorten or lengthen its expansion in one direction in space.

In an embodiment, the MEMS component has a second ferroelectric layer disposed on the first electrode opposite the first ferroelectric layer, and a third electrode disposed on a first surface of the second ferroelectric layer. The first surface of the second ferroelectric layer is arranged to face away from the first electrode. I.e. the second electrode and the third electrode mark off a block consisting of a first ferroelectric layer, a first electrode and a second ferroelectric layer on opposite sides, the first electrode being disposed between the first ferroelectric layer and the second ferroelectric layer such that the second ferroelectric layer separates the first electrode from the third electrode, and that the first ferroelectric layer separates the first electrode from the second electrode. The first ferroelectric layer and the second ferroelectric layer comprise ferroelectric material as described herein. Deposition of the first ferroelectric layer and the second ferroelectric layer for the multilayer MEMS component may be performed in a single process. For example, the second electrode may first be produced in the form of a cuboid of conductive material, and then the first ferroelectric layer may be deposited on a surface of the second electrode such that the polarity of the first ferroelectric layer is perpendicular to the contacting surface of the second electrode. For example, the polarity of the first ferroelectric layer may point either to that surface of the second electrode which is located between the second electrode and the first ferroelectric layer, or away from said surface. For example, the first ferroelectric layer may be in the shape of a cuboid. On a surface of the first ferroelectric layer opposite the second electrode, for example, the first electrode may be applied in the form of a cuboid of electrically conductive material, and on a surface of the first electrode, opposite the surface in contact with the first ferroelectric layer, a cuboid of ferroelectric material may be applied which represents the second ferroelectric layer, for example. The polarity of this second ferroelectric layer should be perpendicular to the surface between the first electrode and the second ferroelectric layer. Because the second ferroelectric layer may be deposited by the same process or in the same process as the first ferroelectric layer, the second ferroelectric layer will have the same polarity as the first ferroelectric layer, for example. On a surface of the second ferroelectric layer, a third electrode is deposited opposite the first electrode. By means of the first electrode, the second electrode and/or the third electrode, a voltage may be applied, e.g., to the first ferroelectric layer and/or second ferroelectric layer. This has the advantage that the polarity of the second ferroelectric layer may be switched, e.g., by applying a switchover voltage to the first electrode and to the third electrode. By switching the polarity of the second ferroelectric layer, the polarity of the second ferroelectric layer points in the direction opposite to that of the polarity of the first ferroelectric layer. In this case, if a voltage lower than the switchover voltage is applied to the first electrode, the second electrode and the third electrode, both ferroelectric layers may contract or expand simultaneously. Due to the opposite polarities of the first ferroelectric layer and the second ferroelectric layer, the force with which a MEMS component may bend, for example, increases. In addition, only one electrode (e.g. the first electrode) may be used between the first ferroelectric layer and the second ferroelectric layer, in contrast to known embodiments of a multilayer system with purely piezoelectric material, where an additional electrode may be used and where the two electrodes may be separated by an insulating layer. Therefore, with this MEMS component, the number of insulating layers and electrodes can be reduced to a minimum.

In an embodiment, the first electrode of the MEMS component has a first electrode layer and a second electrode layer. The first and second electrode layers have an insulating layer arranged between them which has a neutral plane located therein. In this MEMS component, the first ferroelectric layer and the second ferroelectric layer may be deposited in one process, and because of the multilayer system, the force of the MEMS component increases. By introducing the isolation layer, the first ferroelectric layer may be controlled independently of the second ferroelectric layer. For example, the first ferroelectric layer may be controlled by applying a voltage to the second electrode and to the second electrode layer, and the second ferroelectric layer may be controlled by applying a voltage to the third electrode and to the first electrode layer. Furthermore, the additional layer (insulating layer) may be used as a carrier material during production, for example.

In an embodiment, the first electrode of the MEMS component has a first electrode layer and a second electrode layer. The first and second electrode layers have a passive layer arranged between them which has a neutral plane located therein. Because of the passive layer, for example, the second ferroelectric layer on one side of the neutral plane may have a different force effect on the MEMS component than the first ferroelectric layer on the other side of the neutral plane. Thus, for example, bending of the MEMS component and, thus, the bending force of the MEMS component may be enhanced.

In an embodiment, the MEMS component comprises a third ferroelectric layer disposed on the third electrode, opposite the second ferroelectric layer, a fourth electrode disposed on a first surface of the third ferroelectric layer, the first surface of the third ferroelectric layer being arranged to face away from the third electrode, a fourth ferroelectric layer disposed on the second electrode, opposite the first ferroelectric layer, and a fifth electrode disposed on a first surface of the fourth ferroelectric layer. The first surface of the fourth ferroelectric layer is arranged to face away from to the second electrode. This MEMS component comprises four ferroelectric layers. The more layers the MEMS component comprises, the greater the force of the MEMS component will be. By using the ferroelectric material specifically described herein, the polarities of the individual ferroelectric layers may thus be switched by applying a switchover voltage so that the forces of the individual ferroelectric layers will interact such that the total force of the MEMS component will become very large. Moreover, no additional insulating layers are required in this multilayer system. The first electrode, the second electrode and the third electrode may each be used by two ferroelectric layers. Because the polarities of individual ferroelectric layers may be changed even after the MEMS component has been fabricated, the ferroelectric layers of the multilayer may be deposited by or in one single process.

In an embodiment, a passive layer is arranged at the second electrode of the MEMS component. By using this multilayer system, the combined force of the individual forces of the individual ferroelectric layers may be coupled onto the passive layer. This may cause the passive layer to be deflected.

In an embodiment, the passive layer of the MEMS component is connected to a substrate on at least one side. Thus, for example, the passive layer is firmly anchored on one side and freely movable on the opposite side. This design further increases the effect of the MEMS component, since the deflection of the MEMS component may now only take place on the freely movable side of the passive layer and, thus, more pronounced deflection may be achieved on this side than if the MEMS component were deflected on both sides. In addition, the anchoring (connection of the MEMS component to the substrate) causes spatial fixation of the component, for example.

In an embodiment, the MEMS component includes a multilayer MEMS actuator, a multilayer MEMS sensor or a multilayer MEMS generator. By using the ferroelectric material in a multilayer MEMS actuator, a multilayer MEMS sensor or a multilayer MEMS generator, these may be manufactured more cost-effectively and efficiently because the ferroelectric layers may be deposited in or by a single process and since the desired polarities of the individual ferroelectric layers may be subsequently adjusted. If the MEMS component comprises a multilayer MEMS actuator, a multilayer MEMS sensor or a multilayer MEMS generator, the MEMS component may also have, for example, different structural design and connection techniques (packaging techniques), such as at least one suspension, at least one connection to a substrate, at least one connection to a membrane, etc. and/or combinations thereof.

In an embodiment, a MEMS device has a substrate and a first MEMS component. A passive layer of the MEMS component is deflectably arranged on the substrate. This means that the passive layer is, e.g., firmly anchored on one side and freely movable on the opposite side. This design further increases the effect of the MEMS component, since the deflection of the MEMS component may now take place only on the freely movable side of the passive layer and, thus, higher deflection may be achieved on this side than if the MEMS component were deflected on both sides.

In an embodiment, the MEMS device comprises a second MEMS component. The first and second passive layers form a community, and the electrodes and the ferroelectric layers of the first and second MEMS components are arranged in parallel. With the aid of this MEMS device, the deflection of the common passive layer of the first MEMS component and of the second MEMS component is more pronounced because in this MEMS device, the first MEMS component and the second MEMS component, which are arranged in parallel with each other, cooperate to apply a greater bending force to the common passive layer, which results in that the deflectable side of the MEMS device undergoes intense deflection. In addition, this setup may also cause torsion of the common passive layer, for example, when the first MEMS component is excited, by applying a voltage, in antiphase to the second MEMS component, which also has a voltage applied to it.

A further embodiment provides a process of manufacturing a MEMS component. The method comprises stacking a first electrode, a first ferroelectric layer, a second electrode, a second piezoelectric layer and a third electrode in this order. The first ferroelectric layer and the second piezoelectric layer have the same polarization direction, and the first ferroelectric layer includes ferroelectric material comprising a mixed crystal including AlN and at least one nitride of a transition metal. The proportion of the nitride of the transition metal is selected such that the polarity of the ferroelectric material is switchable by applying a switchover voltage. The switchover voltage is below a breakdown voltage of the ferroelectric material. The method further comprises the following step: applying a switchover voltage to the first electrode and to the second electrode. The polarization direction of the first ferroelectric layer is thereby reversed, so that the polarization direction of the first ferroelectric layer is reversed (for example, opposite to the polarization direction of the second piezoelectric layer).

Another embodiment provides a method of manufacturing a MEMS component in which the first electrode, the first ferroelectric layer, the second electrode, the second piezoelectric layer and the third electrode are stacked on a substrate, and the method further comprises the following step:

integrating one or more circuit components of an integrated circuit using a CMOS process in the substrate before or after stacking of the first electrode, the first ferroelectric layer, the second electrode, the second piezoelectric layer and the third electrode.

The methods are based on the same considerations as for the ferroelectric material, the MEMS component, and the MEMS device as described above.

Incidentally, the methods may be further supplemented by all of the features and functionalities described herein also with respect to the inventive ferroelectric material, MEMS component and MEMS device.

Before embodiments of the present invention will be explained in detail below on the basis of the drawings, it shall be pointed out that elements, objects and/or structures that are identical, identical in functional or similar in action are provided with the same reference numerals in the different figures, so that the descriptions of said elements that are presented in different embodiments are interchangeable and/or mutually applicable.

BRIEF DESCRIPTION OF THE DRAWINGS

Embodiments of the present invention will be detailed subsequently referring to the appended drawings, in which.

DETAILED DESCRIPTION OF THE INVENTION

Figure 1A:
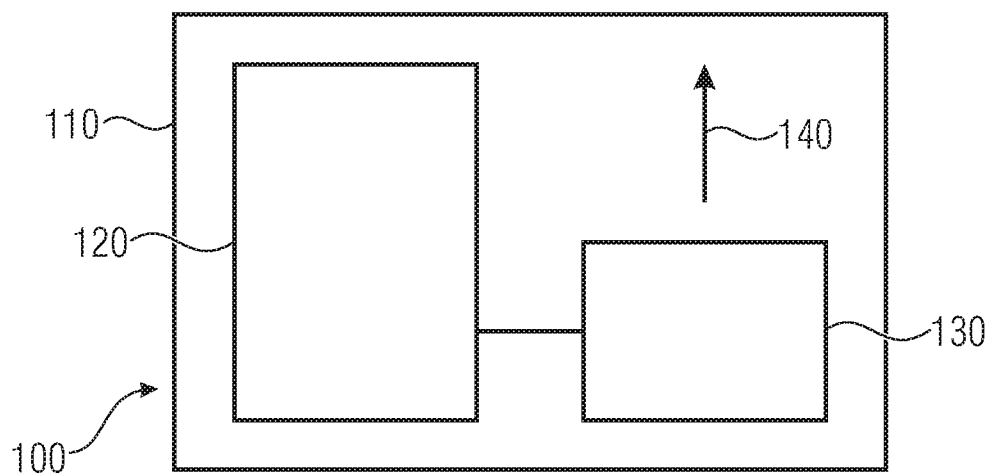
FIG. 1a shows a schematic representation of a ferroelectric material according to an embodiment of the present invention.

FIG. 1a shows a schematic representation of a ferroelectric material 100 comprising a mixed crystal 110 according to an embodiment of the present invention. The mixed crystal 110 comprises AlN 120 and at least one nitride of a transition metal TMN 130. The AlN 120 forms a chemical compound AlTMN with the nitride of a transition metal TMN 130. FIG. 1a is only a schematic sketch; even if in FIG. 1a the AlN 120 and the nitride of a transition metal TMN 130 are shown to be spatially separated, this is not the case in reality. In the mixed crystal 110, for example, the chemical compound AlTMN is homogeneously distributed. The proportion of the nitride of the transition metal TMN 130 may be adjusted. A ratio of a number of transition metal atoms TM of the nitride of the transition metal TMN 130 to a sum of the number of transition metal atoms of the nitride of the transition metal TMN 130 and a number of aluminum atoms of AlN 120 lies within a range ≥0.2 and ≤0.5, the ratio may also lie within a range ≥0.25 and ≤0.43, within a range ≥0.30 and ≤0.38 or within a range ≥0.32 and ≤0.36 such as 0.36, for example. Thus, the chemical bond between AlN 120 and the nitride of the transition metal TMN 130 may be represented as $Al_{1-x}TM_xN$, where x is the ratio of a number of transition metal atoms TM of the nitride of the transition metal TMN 130 to a sum of the number of transition metal atoms of the nitride of the transition metal TMN 130 and a number of aluminum atoms of AlN 120. For example, increasing the proportion of the nitride of the transition metal TMN 130 causes the mixed crystal 110 to become ferroelectric. The transition metal TM of the nitride of the transition metal TMN 130 may, for example, be scandium SC, yttrium Y, titanium Ti, niobium Nb or chromium Cr. The mixed crystal 110 has a polarity 140.

For the ferroelectric material 100, for example, the intrinsic mechanical stress may be adjusted. Furthermore, the dielectric losses of the mixed crystal 110 are lower than in classical ferroelectrics such as PZT.

Using $Al_{1-x}Sc_xN$ as an example, the ferroelectric material may be produced at deposition temperatures as low as 400° C. and is therefore, like pure AlN, CMOS-compatible. The high electric strength of pure AlN (>400 V/μm) is also retained in $Al_{1-x}Sc_xN$. The low dielectric losses of usually well below 1% [12] and the possibility of adjusting the intrinsic mechanical stress of the ferroelectric material are also retained [11]. The ferroelectric material is CMOS-compatible.

Figure 1B:
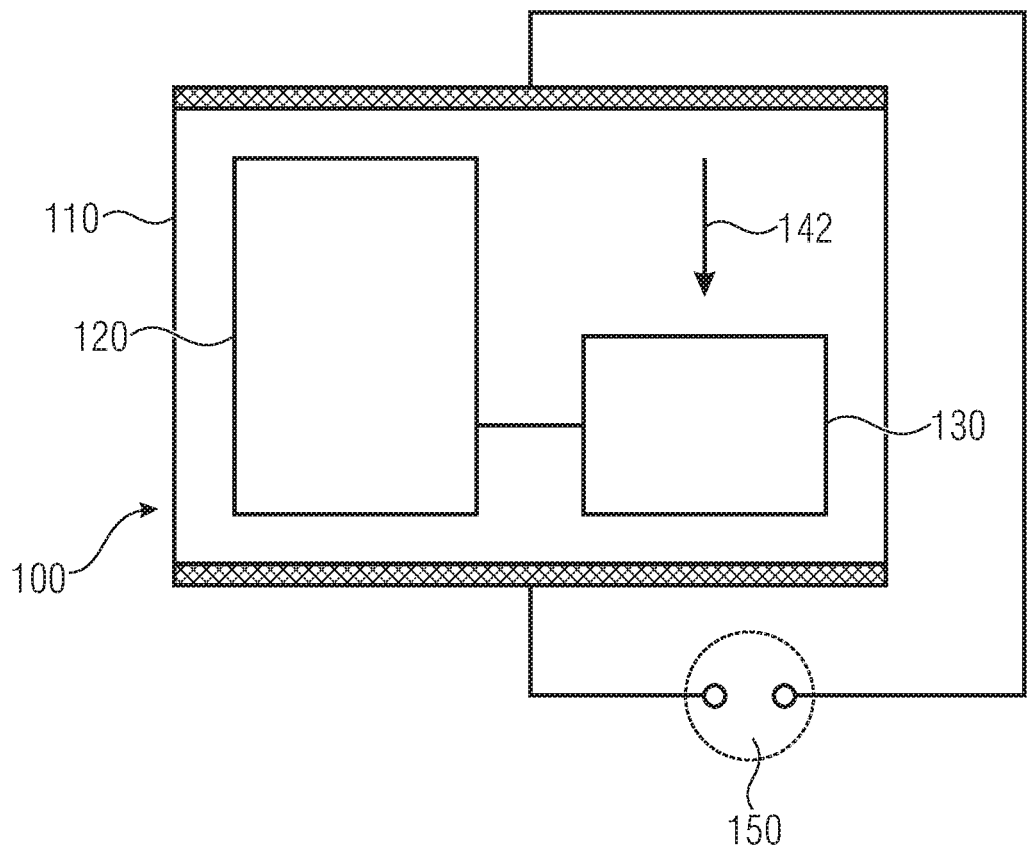
FIG. 1b shows a schematic representation of a ferroelectric material with applied switchover voltage according to an embodiment of the present invention.

FIG. 1b shows the ferroelectric material 100 according to an embodiment of the present invention in accordance with the ferroelectric material 100 of FIG. 1a. The ferroelectric material 100 comprises a mixed crystal 110. The mixed crystal 110 comprises AlN 120 and at least one nitride of a transition metal 130. A switchover voltage 150 is applied to the ferroelectric material 100, thereby setting the polarity 142. This means, for example, that by applying the switchover voltage 150, the original polarity 140 (see FIG. 1a) may be switched such that the new polarity 142 is opposite to the old polarity 140. For this purpose, the switchover voltage 150 may be below a breakdown voltage of the ferroelectric material 100. If a lower voltage than the switchover voltage 140 is applied to the ferroelectric material 100, the direction of the polarity 140 will not change.

The existence of ferroelectric materials based on AlN 120 has never before been demonstrated experimentally, according to the current state of knowledge. Experimental scientific publications and patents on mixed crystals 110 of AlN 120 and the nitrides of transition metals 130, such as AlScN [13, 14], AlYN [15, 16], or AlTiN [17, 18] only concern material properties such as piezoelectric coefficients and elasticity as a function of the transition metal proportion. No evidence of ferroelectricity has been published by the respective authors. The ferroelectric material 100 has now been changed in such a way, by increasing the proportion of the nitride of the transition metal 130 and by adapting the mechanical stress toward less compressive stress or more tensile stress, that the polarity 140 of the ferroelectric material 100 may be switched over by applying a switchover voltage 140.

Figure 2:
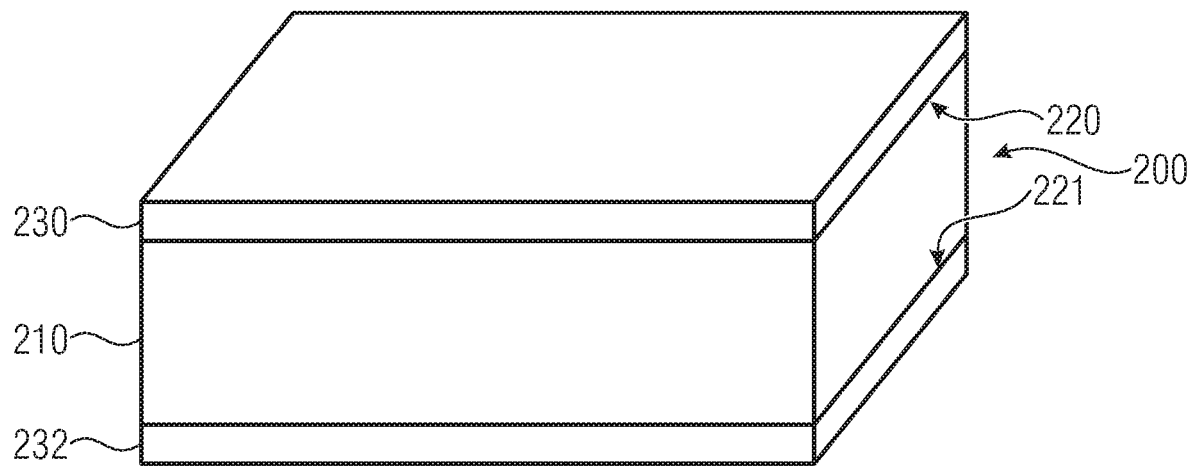
FIG. 2 shows a schematic representation of a MEMS component according to an embodiment of the present invention.

FIG. 2 shows a MEMS component 200 comprising a first ferroelectric layer 210, which includes the ferroelectric material, according to an embodiment of the present invention. Further, the MEMS component comprises a first electrode 230 disposed on a first surface 220 of the first ferroelectric layer 210 and a second electrode 232 disposed on a second surface 221 of the first ferroelectric layer 210. The second surface 221 is opposite the first surface 220. For example, the first electrode 230 and the second electrode 232 are made of electrically conductive material. A voltage may be applied to the ferroelectric layer 210 via the first electrode 230 and the second electrode 232. If the applied voltage is lower than the switchover voltage, the direction of the polarity of the ferroelectric layer 210 will not change. However, if the voltage is as high as the switchover voltage that may be used, the polarity of the ferroelectric layer 210 may be switched. If this MEMS component is operated at a voltage lower than the switchover voltage, the expansion of the ferroelectric layer 210 into one of the three spatial directions will change, for example. With this MEMS component, this conversion of the supplied electrical voltage into mechanical movement may be used in many ways. However, it is also possible that a reverse conversion may be detected. For example, the expansion of the ferroelectric layer 210 into at least one spatial direction may be changed, and a resulting electrical signal may then be measured via the first electrode 230 together with the second electrode 232.

Figure 3:
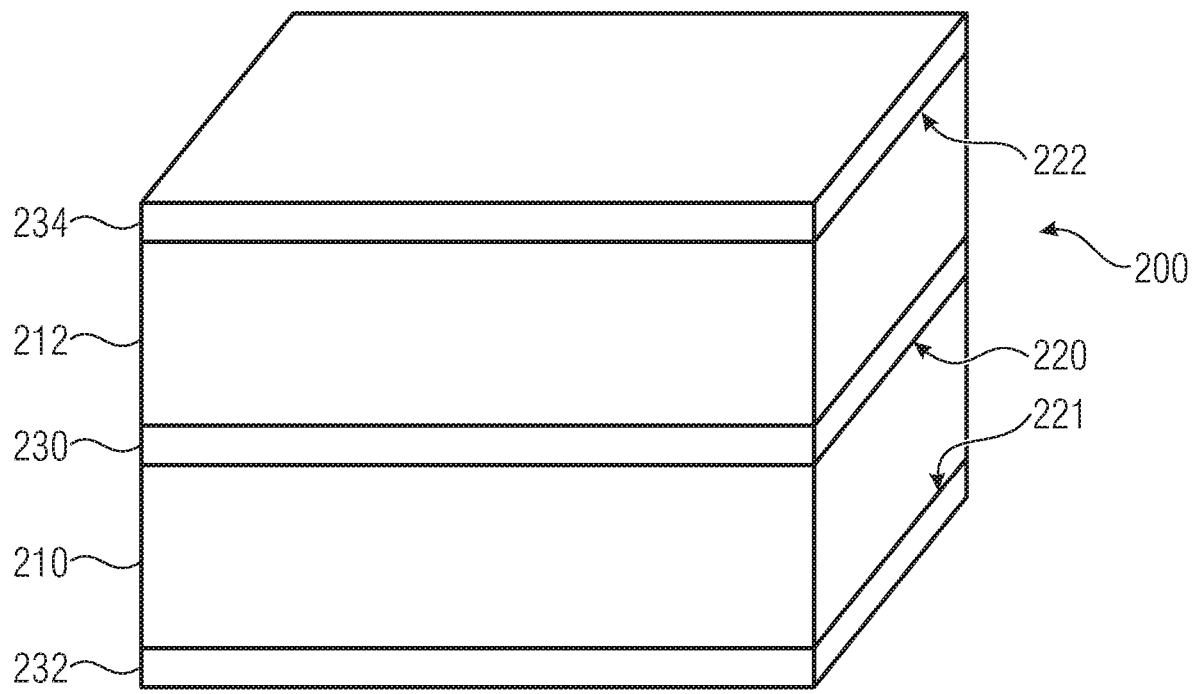
FIG. 3 shows a schematic representation of a MEMS component comprising two ferroelectric layers according to an embodiment of the present invention.

FIG. 3 shows a MEMS component 200 comprising a first ferroelectric layer 210, a second ferroelectric layer 212, a first electrode 230 located between the first ferroelectric layer 210 and the second ferroelectric layer 212, a second electrode 232 attached to the second surface 221 of the first ferroelectric layer 210, and a third electrode 234 attached to a first surface 222 of the second ferroelectric layer 212 according to an embodiment of the present invention. The first electrode 230 is disposed on the first surface 220 of the first ferroelectric layer 210. The second surface 221 of the first ferroelectric layer 210 is opposite to the first surface 220 of the first ferroelectric layer 210. The second ferroelectric layer 212 disposed on the first electrode 230, opposite the first ferroelectric layer 210, comprises the ferroelectric material. The third electrode 234 is disposed on the surface 222 of the second ferroelectric layer 212. The first surface 222 of the second ferroelectric layer 212 is arranged to face away from the first electrode 230. The first ferroelectric layer 210 also includes the ferroelectric material.

On the basis of the inventive ferroelectric mixed crystals (ferroelectric material), multilayer actuators (such as the MEMS component 200) which are as simple as possible may thus be implemented without having to accept the specific disadvantages of classical ferroelectrics. Similarly, the simplest possible concepts for intrinsic charge amplification may be implemented without these disadvantages. These might also be implemented with the MEMS component 200. The material and its integration, and, thus, the MEMS component, are CMOS-compatible since the ferroelectric material may be deposited at temperatures below 500° C. The ferroelectric layers of the multilayer may be deposited in a single process since the polarization direction does not have to be manipulated in situ, but the polarization of the individual layers may be changed even after production by applying a switchover voltage. Additional layers, which set a certain polarization direction during the deposition process, are therefore not necessary. The number of insulating layers and electrode layers that may be used is minimized because the polarization inversion of the individual ferroelectric layers (e.g. of the first ferroelectric layer 210 and of the second ferroelectric layer 212) is reversible and controllable.

The ferroelectric material, like AlN, may be readily integrated into MEMS process flows (e.g., no process redesign may be necessary), but the range of applications is greatly expanded by the ferroelectric properties of the ferroelectric material. Ferroelectric actuated MEMS components such as loudspeakers, ultrasonic transducers, switches or mirrors would benefit from increased performance as compared to conventional technology—especially if they are to be integrated with CMOS structures. The same applies to sensor systems such as microphones or accelerometers, which may benefit from intrinsic charge amplification, and to micro-generators.

In the manufacture of the MEMS component 200, for example, the first ferroelectric layer 210 and the second ferroelectric layer 212 have the same polarity. For example, the polarity should be arranged to be perpendicular to the second surface 221 of the first ferroelectric layer. If a switchover voltage is applied to the first ferroelectric layer 210 to the first electrode 230 and to the second electrode 232, the polarity of the first ferroelectric layer 210 will be switched. Thus, the polarity of the first ferroelectric layer 210 points in the direction opposite to that of the polarity of the second ferroelectric layer 212. For example, if the MEMS component 200 is operated at the same voltage (the second electrode 232 and the third electrode 234 have the same voltage level, for example, and the first electrode 230 has the same voltage level with reversed sign), the electric fields (a first electric field penetrating the first ferroelectric layer 210 and a second electric field penetrating the second ferroelectric layer 212) point in opposite directions. Since the polarity and direction of the electric field applied to the respective ferroelectric layer (first ferroelectric layer 210 and second ferroelectric layer 212) are in opposite directions in relation to the respectively other ferroelectric layer, both ferroelectric layers will have the same force response to the electric signal. For example, both the polarity and the direction of the electric field of the first ferroelectric layer point in a same first direction, and the polarity and the direction of the electric field of the second ferroelectric layer point in a same second direction, the first direction being opposite to the second direction. Thus, the force of the MEMS component 200 increases. Further, given a high switchover voltage at the ferroelectric layer (for example, at the first ferroelectric layer 210 and/or at the second ferroelectric layer 212), which is made of the ferroelectric material, the MEMS component 200 may be operated at high bipolar voltages, i.e., voltages that are positive at one point in time and negative at another point in time.

Figure 4:
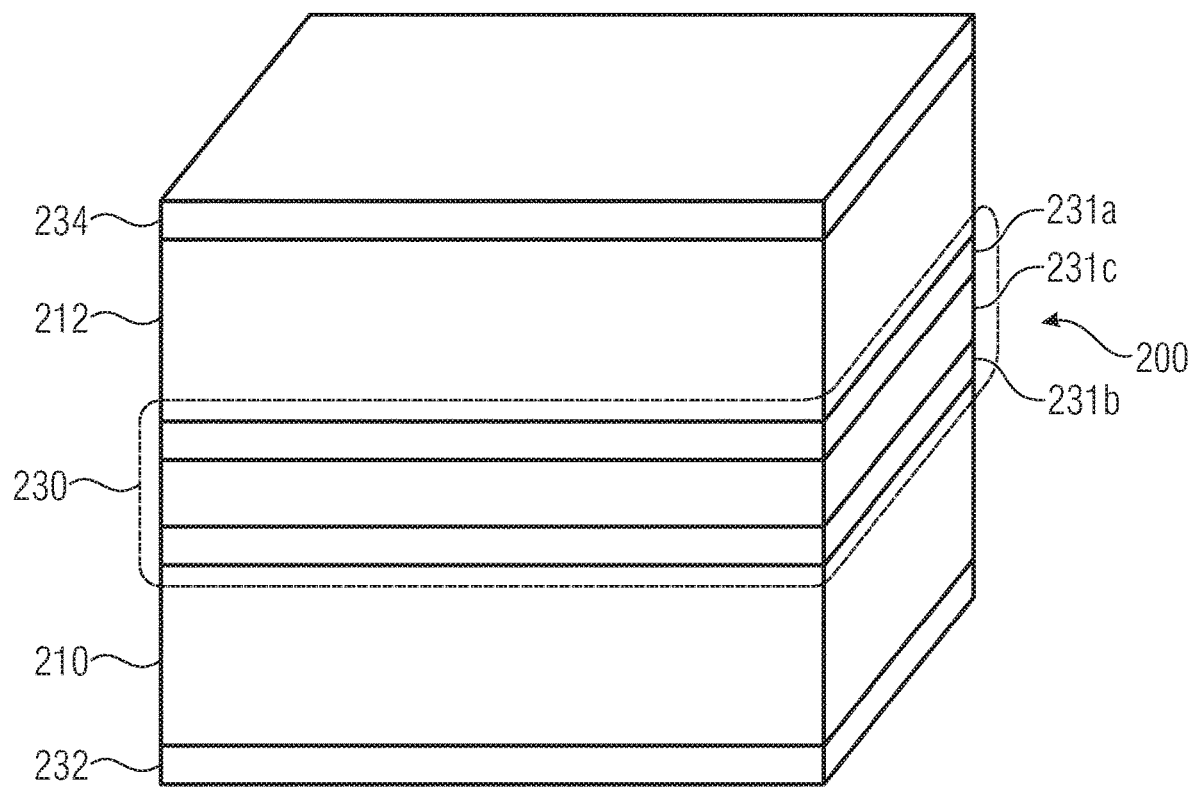
FIG. 4 shows a schematic representation of a MEMS component wherein the first electrode comprises a first electrode layer and a second electrode layer according to an embodiment of the present invention.

FIG. 4 shows a MEMS component 200 comprising a first ferroelectric layer 210, a second ferroelectric layer 212, a first electrode 230, a second electrode 232 and a third electrode 234 according to an embodiment of the present invention. The first electrode 230 of the MEMS component 200 has a first electrode layer 231a and a second electrode layer 231b. For example, the first electrode layer 231a contacts the second ferroelectric layer 212, and the second electrode layer 231b contacts, e.g., the first ferroelectric layer 210. The first electrode layer 231a is separated from the second electrode layer 231b by an intermediate layer 231c. The layer 231c has a neutral plane located therein which divides the MEMS component 200, for example centrally. Thus, on one side of the neutral plane there are the first electrode layer 231a, the second ferroelectric layer 212 and the third electrode 234. On the other side of the neutral plane there are thus the second electrode layer 231b, the first ferroelectric layer 210 and the second electrode 232. The layer 231c may be an insulating layer or a passive layer, for example. The layer 231c enables the first ferroelectric layer 210 to be used independently of the second ferroelectric layer 212. The layer 231c may also serve as a carrier material for the electrodes and the ferroelectric layers during their deposition.

Figure 5:
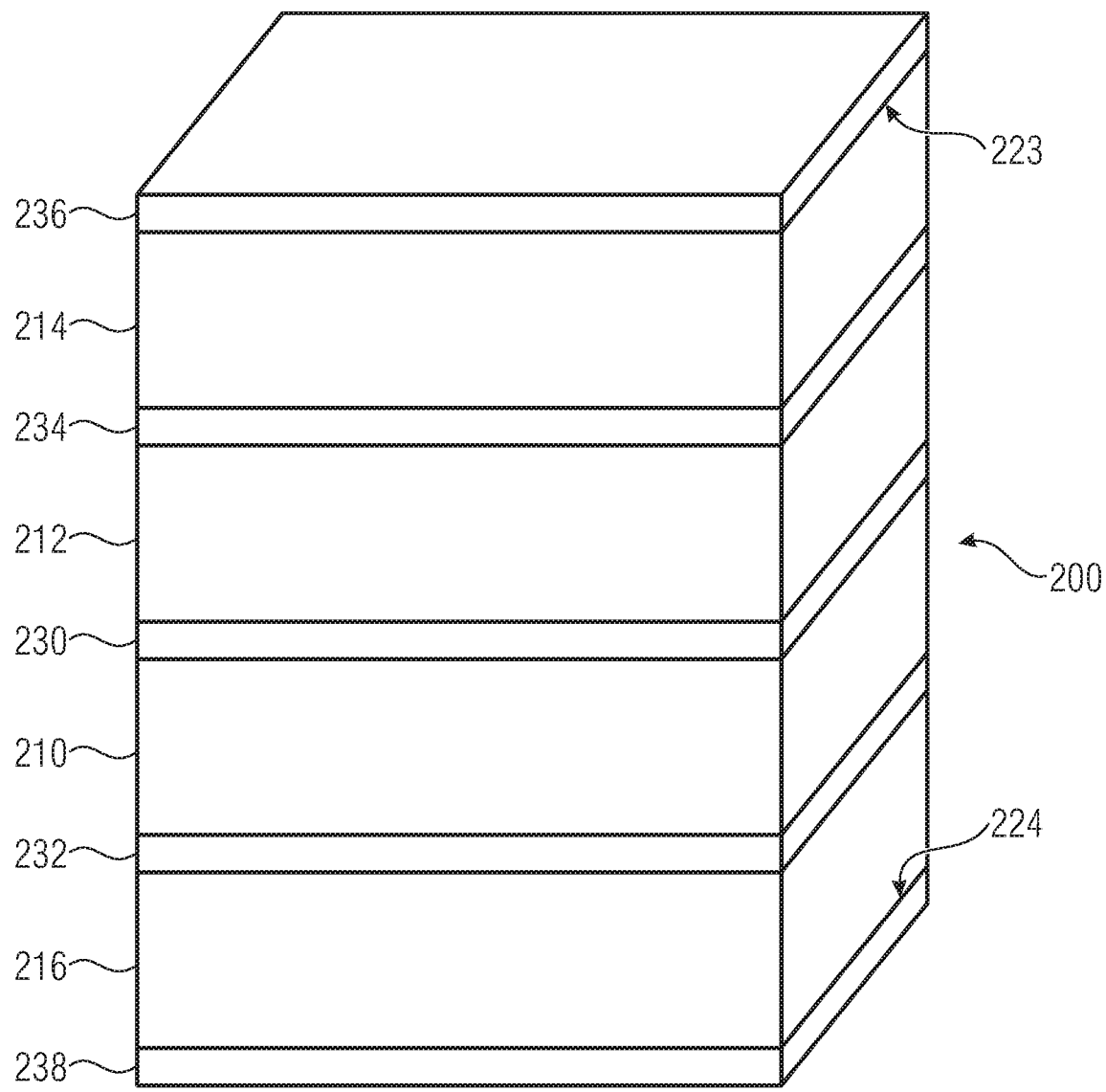
FIG. 5 shows a schematic representation of a MEMS component comprising four ferroelectric layers according to an embodiment of the present invention.

FIG. 5 shows a MEMS component 200 comprising a first ferroelectric layer 210, a second ferroelectric layer 212, a first electrode 230, a second electrode 232 and a third electrode 234 according to an embodiment of the present invention, such as the MEMS component 200 of FIG. 3. In addition, the MEMS component 200 of FIG. 5 has a third ferroelectric layer 214 disposed on the third electrode 234, opposite the second ferroelectric layer 212, a fourth electrode 236 disposed on a first surface 223 of the third ferroelectric layer 214, a fourth ferroelectric layer 216 disposed on the second electrode 232, opposite the first ferroelectric layer 210, and a fifth electrode 238 disposed on a first surface 224 of the fourth ferroelectric layer 216. The first surface 223 of the third ferroelectric layer 214 is arranged to face away from the third electrode 234. The first surface 224 of the fourth ferroelectric layer 216 is arranged to face away from the second electrode 232. The MEMS component 200 has four ferroelectric layers (the first ferroelectric layer 210, the second ferroelectric layer 212, the third ferroelectric layer 214, and the fourth ferroelectric layer 216), thereby forming a multilayer MEMS component. The more ferroelectric layers a MEMS component 200 has, the greater the force of the MEMS component 200 or the intrinsic charge amplification will be.

Figure 6:
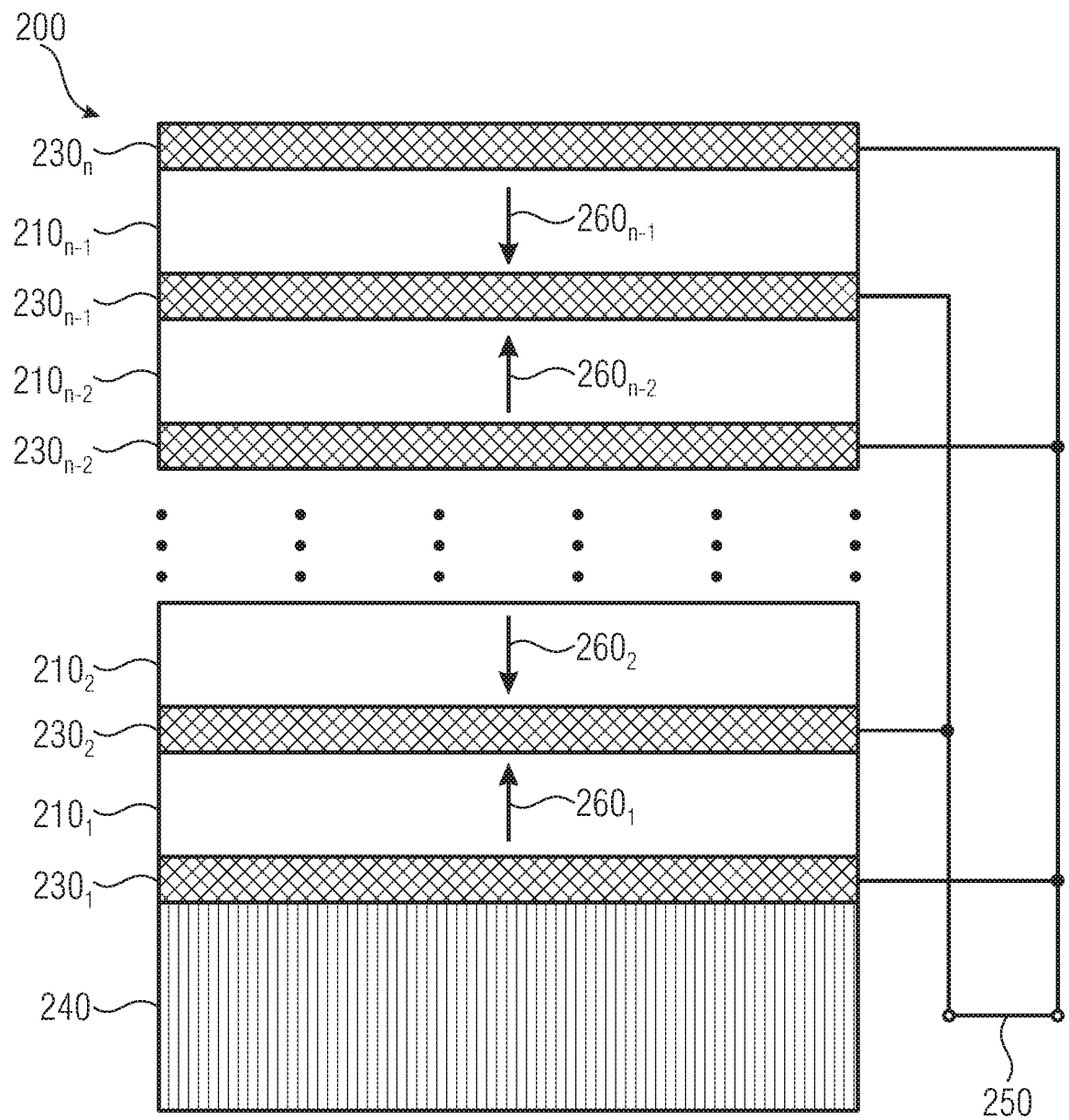
FIG. 6 shows a schematic representation of a MEMS component comprising a substrate according to an embodiment of the present invention.

FIG. 6 shows a MEMS component 200 comprising electrodes $230_1$ to $230_n$, ferroelectric layers $210_1$ to $210_{n-1}$, a substrate 240, and a power supply 250 according to an embodiment of the present invention. Here, the index n is a natural number larger than or equal to 2 (for example, n≥10, n≥100 or n≥1000, such as n=1253). The substrate 240 is arranged at a first electrode $230_1$. The power supply 250 is connected to the electrodes $230_1$ to $230_n$. Each ferroelectric layer $210_1$ to $210_{n-1}$ has a polarity $260_1$ to $260_{n-1}$. The power supply 250 is connected to the ferroelectric layers $210_1$ to $210_{n-1}$ via the electrodes $230_1$ to $230_n$, such that the direction of the electric field (which penetrates the individual ferroelectric layers $210_1$ to $210_{n-1}$ and may have a different direction for each ferroelectric layer $210_1$ to $210_{n-1}$) is either parallel to, and oriented in the same direction as, the respective polarization $260_1$ to $260_{n-1}$ of each ferroelectric layer $210_1$ to $210_{n-1}$ or is parallel to, and oriented in the opposite direction to, the respective polarization $260_1$ to $260_{n-1}$ of the respective ferroelectric layers $210_1$ to $210_{n-1}$. Thus, in each ferroelectric layer $210_1$ to $210_{n-1}$, for example, the direction of the polarity $260_1$ to $260_{n-1}$ is directed in parallel with the direction of the electric field provided by the power supply 250, or the direction of polarization $260_1$ to $260_{n-1}$ in each ferroelectric layer $210_1$ to $210_{n-1}$ is directed opposite to the direction of the electric field provided by the power supply 250. Thus, all ferroelectric layers $210_1$ to $210_{n-1}$ have the same force effect, and the force of the MEMS component 200 is thus stronger than it would be with fewer layers (such as n/8 layers, n/4 layers, or even n/2 layers, for example).

During operation of the MEMS component 200, the voltage provided by the power supply 250 is lower than the switchover voltage. Thus, during operation of the MEMS component 200, the direction of the polarity $260_1$ to $260_{n-1}$ of each ferroelectric layer $210_1$ to $210_{n-1}$ is not changed. If the polarity $260_1$ to $260_{n-1}$ of one or more ferroelectric layers $210_1$ to $210_{n-1}$ is to be switched, the power supply 250 may provide a switchover voltage. For this purpose, at least two electrodes, which have a ferroelectric layer sandwiched between them, may be supplied with the switchover voltage. For example, the switchover voltage may be applied to the electrode $230_1$ and the electrode $230_2$, thus reversing the polarity $260_1$ of the ferroelectric layer $210_1$, so that same will point in the direction opposite to that of the polarity $260_1$ set before. Depending on the field of application, the polarity $260_1$ to $260_{n-1}$ may thus be set reversibly and controllably.

It is possible to implement charge amplification in sensor and micro-generator applications by means of polarization-inverted multilayers. On the basis of the ferroelectric material, simplest possible multilayer actuators may be designed. The ferroelectric material used for each ferroelectric layer $210_1$ to $210_{n-1}$ has a high electric breakdown field strength, whereby large forces may be generated.

The ferroelectric layers of the multilayer may be deposited in a single process since there is no need for in situ manipulation of the polarization direction. Additional layers or the addition of further chemical elements that adjust a certain polarization direction during the deposition process are not necessary. The number of insulating layers and electrode layers that may be used is minimized.

Figure 7A:
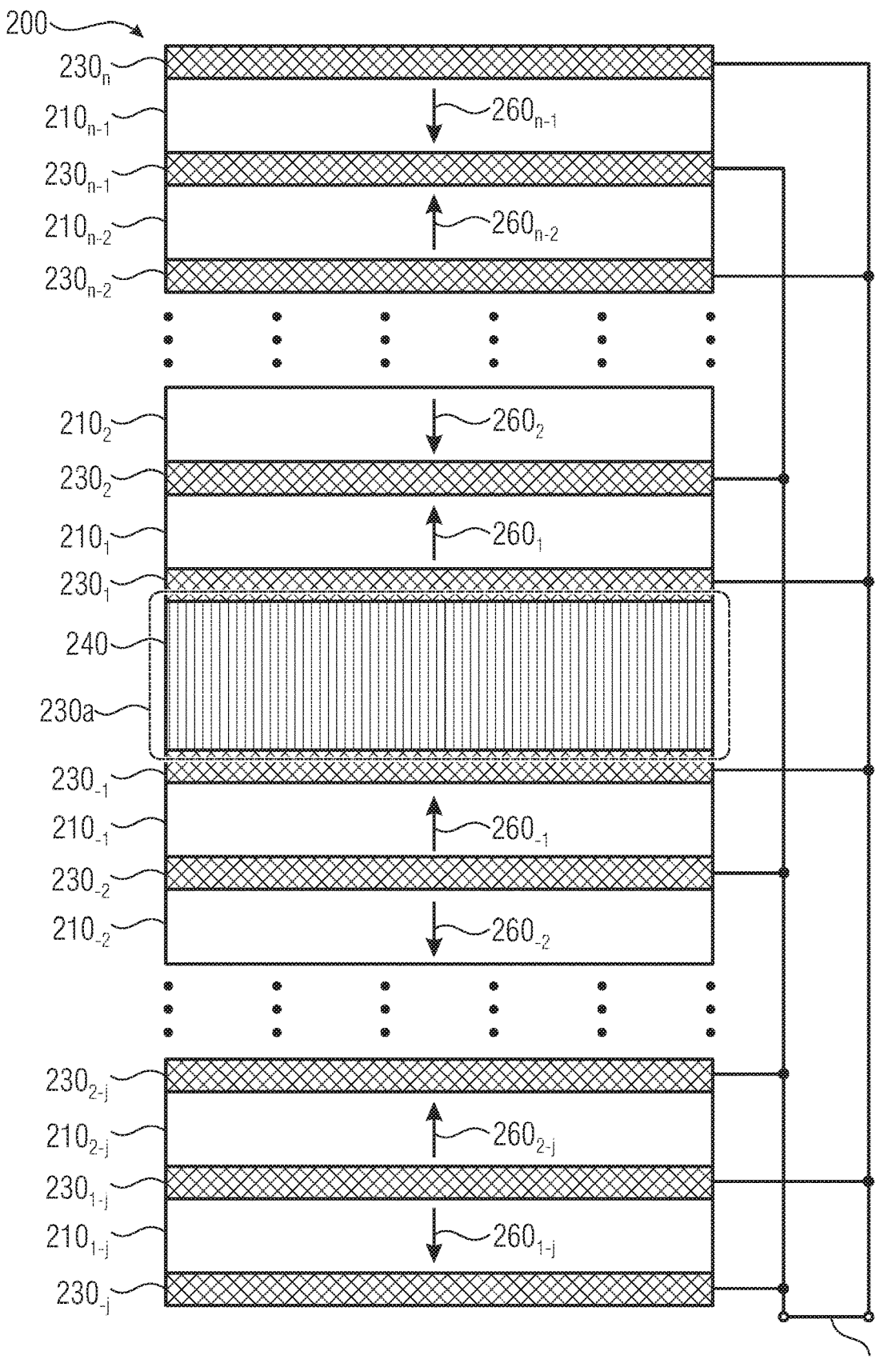
FIG. 7a shows a schematic representation of a MEMS component comprising any number of ferroelectric layers and a substrate according to an embodiment of the present invention.

FIG. 7a shows a MEMS component 200 comprising electrodes $230_{-j}$ to $230_n$, ferroelectric layers $210_{1-j}$ to $210_{n-1}$, a substrate 240, and a power supply 250 according to an embodiment of the present invention. The indices n and j may be any natural number ≥2. Each ferroelectric layer $210_{1-j}$ to $210_{n-1}$ has a polarity $260_{1-j}$ to $260_{n-1}$. The substrate 240 contains a neutral plane. The neutral plane may, for example, centrally divide the MEMS component 200, which means that the same number of identical layers may be found on both sides of the neutral plane (e.g. if n=j). Just because the same number of ferroelectric layers $210_{1-j}$ to $210_{n-1}$ are shown on both sides of the substrate 240 in this embodiment, this does not mean that this is a condition that is a prerequisite for the MEMS component to function. It is also possible that there are more ferroelectric layers on one side of the substrate 240 than on the other side of the substrate (on the opposite side) (e.g. n>j or n<j). An extreme example is the MEMS component 200 of FIG. 6, where no ferroelectric layers are found on one side of the substrate 240 but any number of ferroelectric layers $210_1$ to $210_{n-1}$ may be found on the other side of the substrate 240.

Figure 7B:
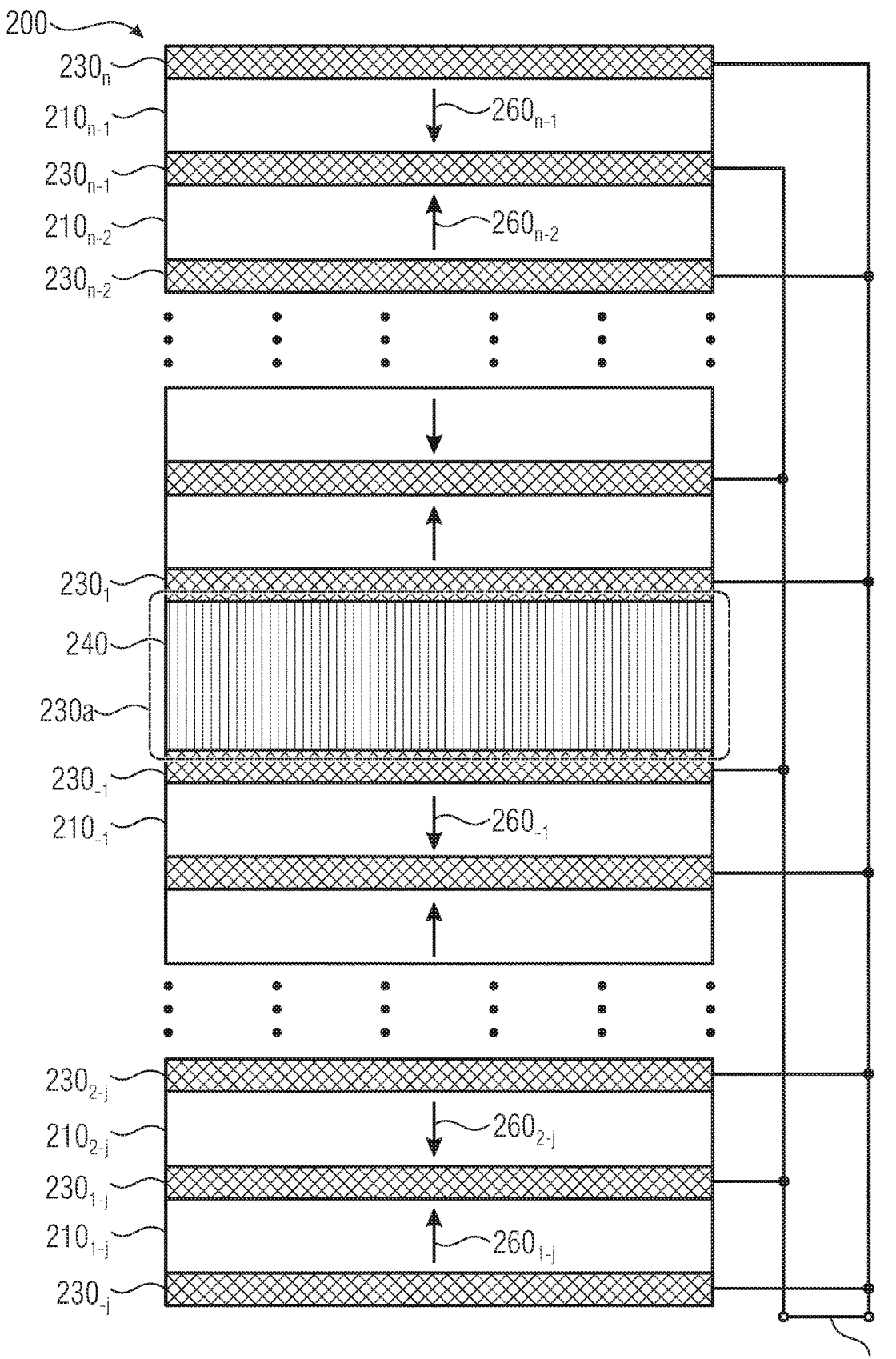
FIG. 7b shows a schematic representation of a MEMS component comprising an arbitrary number of ferroelectric layers, a substrate and electrical contacting of the electrodes according to an embodiment of the present invention.

The MEMS component 200 of FIG. 7b has the same constituents as the MEMS component 200 of FIG. 7A, only the polarity $260_{1-j}$ to $260_{-1}$ of the ferroelectric layers $210_{1-j}$ to $210_{-1}$ points in an opposite direction, and the power supply 250 is connected to the electrodes $230_{-j}$ to $230_n$ in a different way, according to an embodiment of the present invention. The substrate 240 may, for example, represent a passive layer or an insulating layer. In FIG. 7a, for example, it does not matter whether the substrate 240 is an insulating layer or a passive layer, since both electrodes $230_{-1}$ and $230_1$ are connected to the same voltage level of the power supply 250. Thus, the substrate 240 may also be made of electrically conductive material, for example. In contrast, in the MEMS component 200 shown in FIG. 7b, the electrodes $230_{-1}$ and $230_1$ are connected to different voltage levels of the power supply 250, which means that substrate 240 may be an insulating layer, for example, to prevent a short circuit between the electrodes $230_{-1}$ and $230_1$.

Since both the direction of the polarity $260_{1-j}$ to $260_{-1}$ and the connections of the electrodes $230_{-j}$ to $230_{-1}$ to the power supply 250 have been reversed between the MEMS component 200 of FIG. 7a and the MEMS component 200 of FIG. 7b, the MEMS component 200 of FIG. 7a and the MEMS component 200 of FIG. 7b have the same mode of operation. In the two embodiments of the MEMS component 200 of FIG. 7a and of the MEMS component 200 of FIG. 7b, the forces on one side of the substrate 240 are opposed to the forces on the other side of the substrate 240. For example, the ferroelectric layers $210_1$ to $210_{n-1}$ may decrease in size in one spatial direction and that the ferroelectric layers $210_{-1}$ to $210_{1-j}$ may increase in size in the same spatial direction, which results in bending of the MEMS component 200. In addition, lateral actuators are conceivable in which the forces from one side of the neutral plane are rectified with respect to layer systems (the respective ferroelectric layers $210_{1-j}$ to $210_{n-1}$ and the electrodes $230_{-j}$ to $230_n$) located on the other side of the neutral plane.

In other words, the MEMS component 200 of FIG. 7a and the MEMS component 200 of FIG. 7b represent designs with an actively coated passive layer on both sides (substrate 240). Two implementations of electrical contacting are shown, the MEMS component 200 of FIG. 7a not placing any demands on the insulator properties of the passive layer (substrate 240).

Furthermore, the electrode $230_1$ may be regarded as a first electrode layer, and the electrode $230_{-1}$ may be regarded as a second electrode layer of the electrode 230a. Between the first electrode layer and the second electrode layer there is another layer (substrate 240), which layer may be, e.g., a passive layer or an insulating layer.

Figure 7C:
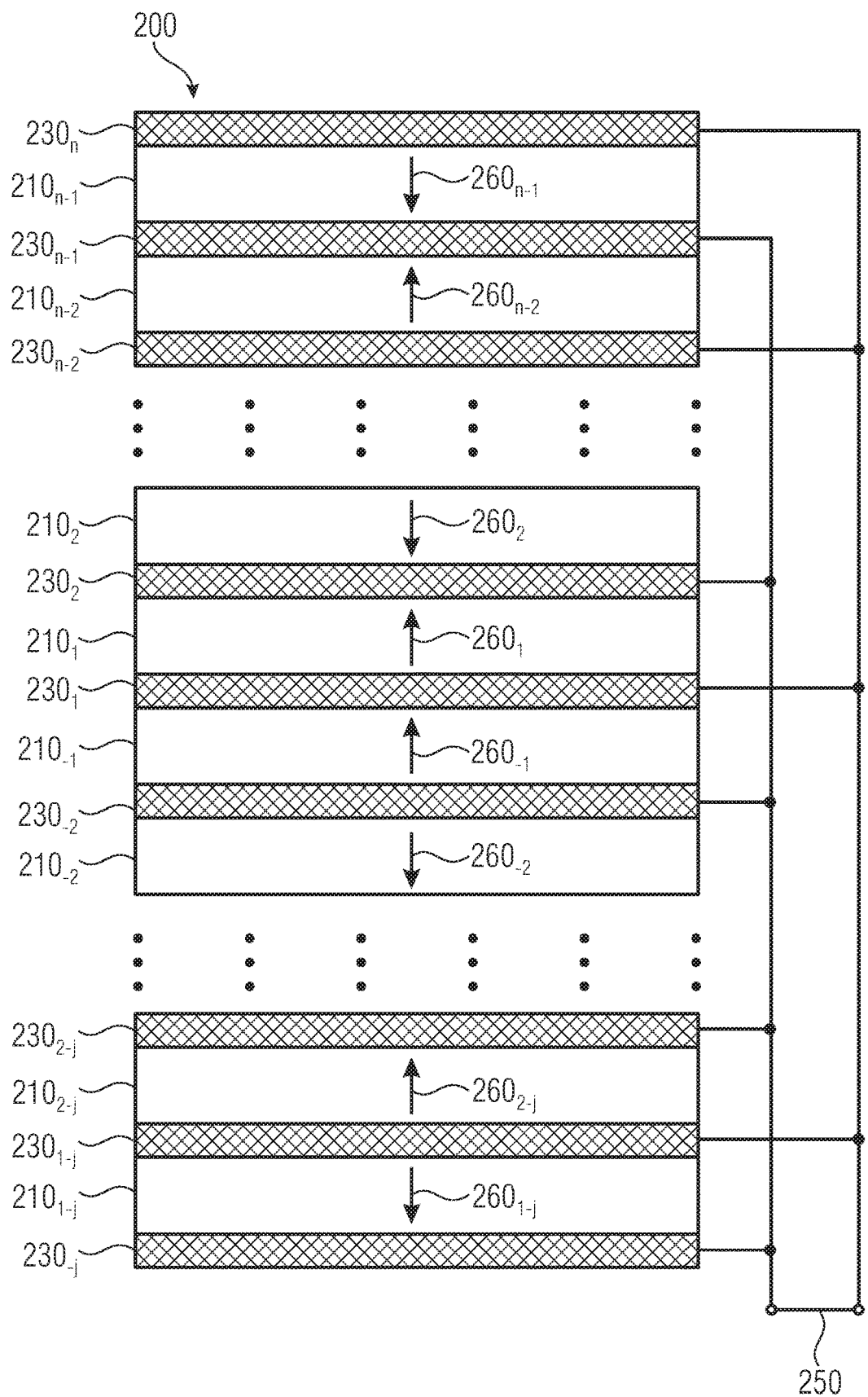
FIG. 7c shows a schematic representation of a MEMS component comprising an arbitrary number of ferroelectric layers according to an embodiment of the present invention.

In FIG. 7c, a MEMS component 200 comprising ferroelectric layers $210_{1-j}$ to $210_{n-1}$, electrodes $230_{-j}$ to $230_n$ and a power supply 250 according to an embodiment of the present invention is shown. Each ferroelectric layer $210_{1-j}$ to $210_{n-1}$ has a polarity $260_{1-j}$ to $260_{n-1}$. The electrode $230_1$ comprises a neutral plane which divides the MEMS component 200 into a first multilayer layer system (all ferroelectric layers $210_1$ to $210_{n-1}$) and a second multilayer layer system (consisting of the ferroelectric layers $210_{-1}$ to $210_{1-j}$). If a voltage lower than the switchover voltage is applied to the power supply 150, in the case of this example, e.g., the ferroelectric layers $210_1$ to $210_{n-1}$ expand, and the ferroelectric layers $210_{-1}$ to $210_{1-j}$ (on the other side of the neutral plane) contract. This mechanism results in bending of the MEMS component 200. The more ferroelectric layers the MEMS component 200 has, the larger the bending force in the MEMS component 200 will be when a voltage is applied to the electrodes $230_{-j}$ to $230_n$ by the power supply 250.

In other words, the MEMS component 200 of FIG. 7c is a version of a MEMS component 200 without a passive layer. For example, the ferroelectric layers $210_1$ to $210_{n-1}$ above the neutral plane (the electrode $230_1$) expand in the direction opposite to that of the ones located beneath (ferroelectric layers $210_{-1}$ to $210_{1-j}$).

With regard to the role of a passive layer (which may also be the substrate itself), three general designs are conceivable: a passive layer actively coated on one side (see the MEMS component 200 of FIG. 6), a passive layer coated on both sides (see the MEMS component 200 of FIG. 7a and the MEMS component 200 of FIG. 7b) and a purely active multilayer system without a passive layer (see the MEMS component 200 of FIG. 7c). All embodiments might generally also be implemented with an inverse material polarisation. AlTMN stands for a ferroelectric mixed crystal based on AlN and the nitride of transition metals (TM), which is the basis for setting the material polarization. At least one of the layers of the MEMS component 200 (of FIG. 3, FIG. 4, FIG. 5, FIG. 6, FIG. 3, FIG. 7a, FIG. 7b and FIG. 7c), which is described here as ferroelectric, contains the ferroelectric material. However, individual ones of the layers described here as ferroelectric may also be purely piezoelectric, as they do not contain the ferroelectric material, for example. As long as there is a minimum number of ferroelectric layers containing the ferroelectric material (e.g. every other layer), it is possible that the function of the component 200 will not change. The embodiments are relevant for both actuation and intrinsic charge amplification (in the latter case, for example, without the power supply 250).

Figure 8A:
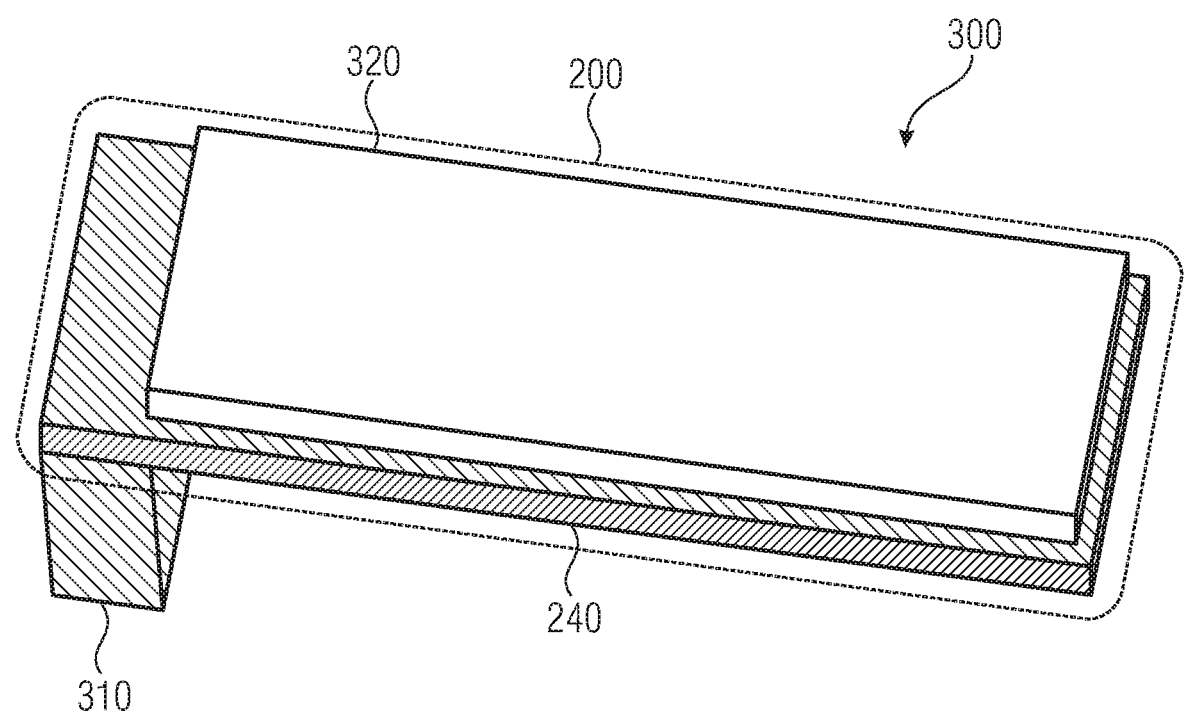
FIG. 8a shows a schematic representation of a MEMS device according to an embodiment of the present invention.

FIG. 8a shows a schematic diagram of a MEMS device 300 comprising a substrate 310 and a first MEMS component 200 according to an embodiment of the present invention. The MEMS component 200 has a passive layer 240 and ferroelectric multilayers 320. The passive layer 240 of the MEMS component 200 is deflectably arranged on the substrate 310, for example. As shown in FIG. 8a, the passive layer 240 may be arranged on one side of the substrate 310. For example, the surface with which the passive layer 240 touches the substrate 310 is located opposite the surface with which the passive layer 240 is arranged at the ferroelectric multilayers 320. However, it is also possible that the ferroelectric multilayers 320 are arranged on the same surface with which the passive layer 240 touches the substrate 310, or on both surfaces of the passive layer 240 (at the surface with which the passive layer 240 touches the substrate 310, and the surface opposite thereto).

The MEMS device 300 in FIG. 8a is an embodiment of a vertical bend actuator.

Figure 8B:
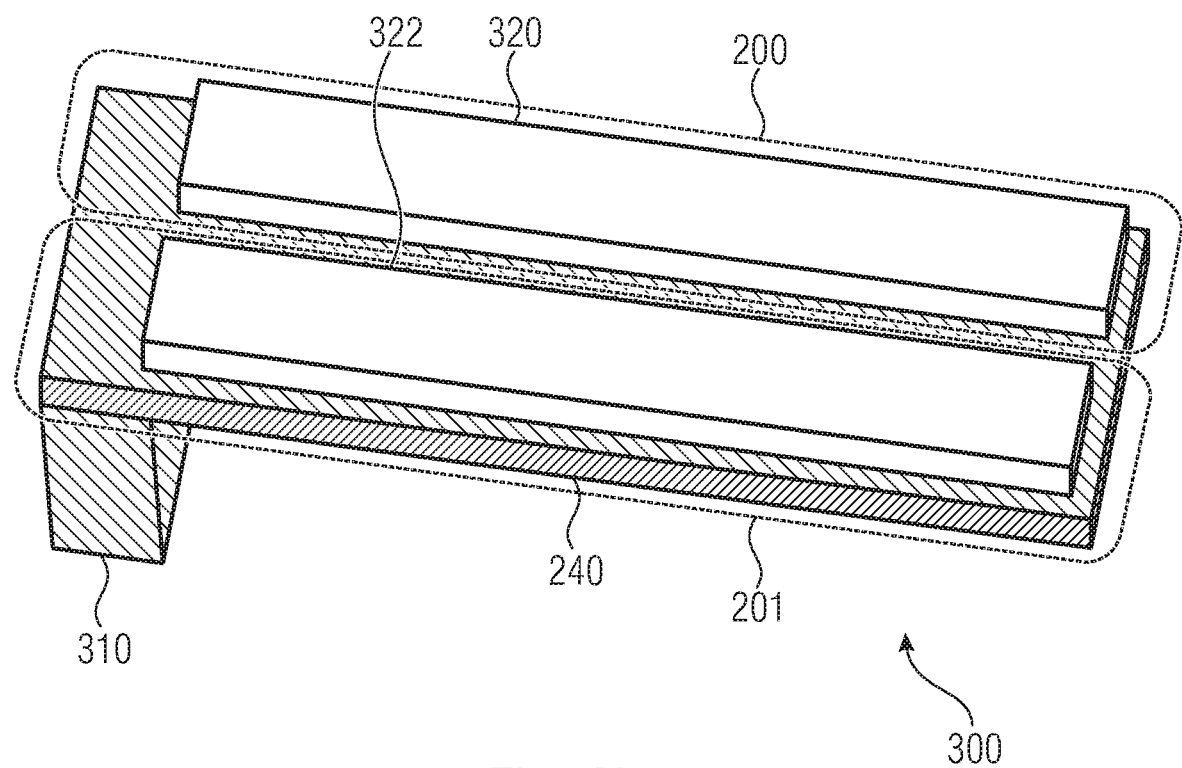
FIG. 8b shows a schematic representation of a MEMS device comprising two MEMS components according to an embodiment of the present invention.

FIG. 8b shows a MEMS device 300 comprising a first MEMS component 200 and a second MEMS component 201 according to an embodiment of the present invention. The first MEMS component 200 has a first passive layer, and the second MEMS component 201 has a second passive layer, wherein the first passive layer and the second passive layer are a community and are marked as the passive layer 240. For example, the first MEMS component 200 and the second MEMS component 201 may exhibit the same design and function. A first ferroelectric multilayer 320 of the first MEMS component 200 is arranged in parallel with a second ferroelectric multilayer 322 of the second MEMS component 201. In other words, the ferroelectric layers (the first ferroelectric multilayer 320 and the second ferroelectric multilayer 322) of the first MEMS component 200 and of the second MEMS component 201 are arranged in parallel. The passive layer 240 is deflectably arranged at the substrate 310. The MEMS device 300 shown in FIG. 8b is an embodiment of a lateral or torsional actuator (the two multilayers (the first ferroelectric multilayer 320 and the second ferroelectric multilayer 322) are excited in phase opposition, for example).

The ferroelectric multilayer 320 of FIG. 8a and the ferroelectric multilayers 320 and 322 of FIG. 8b comprise the ferroelectric material.

Figure 9:
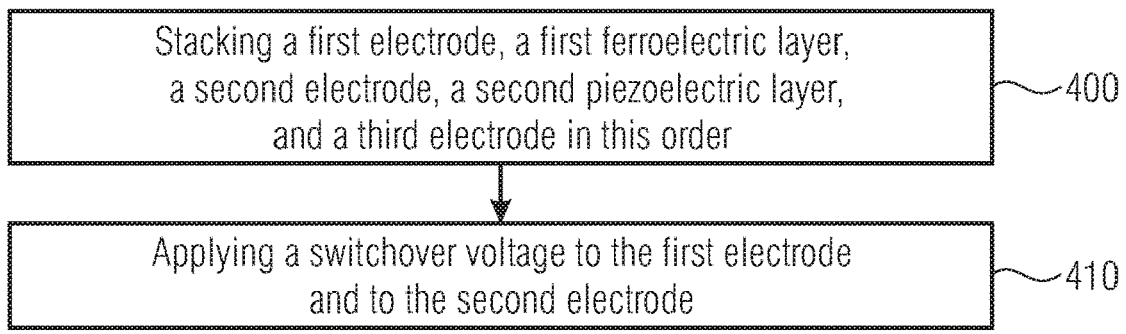
FIG. 9 shows a block diagram of a method of manufacturing a MEMS component according to an embodiment of the present invention.

FIG. 9 shows a block diagram of a method of manufacturing a MEMS component according to an embodiment of the present invention. In one step of the method, for example, a first electrode, a first ferroelectric layer, a second electrode, a second piezoelectric layer and a third electrode are stacked in this order 400. This step produces, for example, a MEMS component such as the MEMS component 200 of FIG. 3 or the MEMS component 200 of FIG. 4. The first ferroelectric layer and the second piezoelectric layer have, for example, the same direction of polarization, and the first ferroelectric layer comprises a ferroelectric material. The ferroelectric material comprises a mixed crystal comprising AlN and at least one nitride of a transition metal. The proportion of the nitride of the transition metal is selected, for example, such that one direction of a polarity of the ferroelectric material is switchable by applying a switchover voltage. The switchover voltage is below a breakdown voltage of the ferroelectric material. The method further comprises the following step: applying 410 a switchover voltage to the first electrode and the second electrode, the polarization direction of the first ferroelectric layer being reversed, so that the polarization direction of the first ferroelectric layer is reversed (for example, opposite to the polarization direction of the second piezoelectric layer).

Figure 10A:
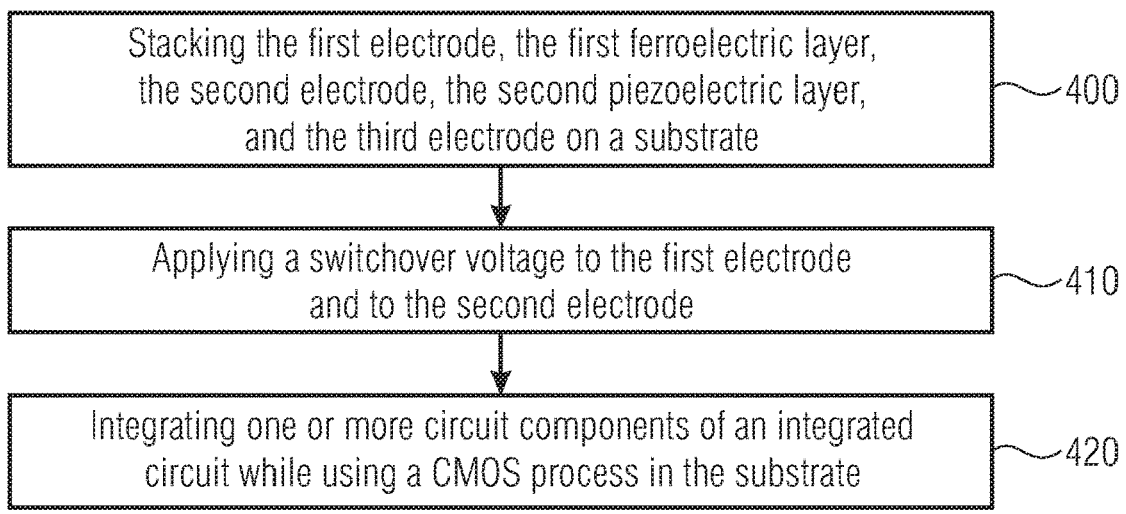
FIG. 10a shows a block diagram of a method of manufacturing a MEMS component connected to a substrate with an integrated circuit while using a CMOS process, according to an embodiment of the present invention.

FIG. 10a shows a block diagram of a method of manufacturing a MEMS component connected to a substrate with an integrated circuit using a CMOS process, according to an embodiment of the present invention. In a first step, the method comprises stacking 400 the first electrode, the first ferroelectric layer, the second electrode, the second piezoelectric layer and the third electrode on a substrate. A second step of the method comprises applying 410 a switchover voltage to the first electrode and to the second electrode, the polarization direction of the first ferroelectric layer being reversed so that the polarization direction of the first ferroelectric layer is reversed. In a further step of the method, one or more circuit components of an integrated circuit are integrated 420 in the substrate while using a CMOS process 420. The steps of stacking 400 and applying 410 are analogous to the steps of stacking 400 and applying 410 of the method shown in FIG. 9.

Figure 10B:
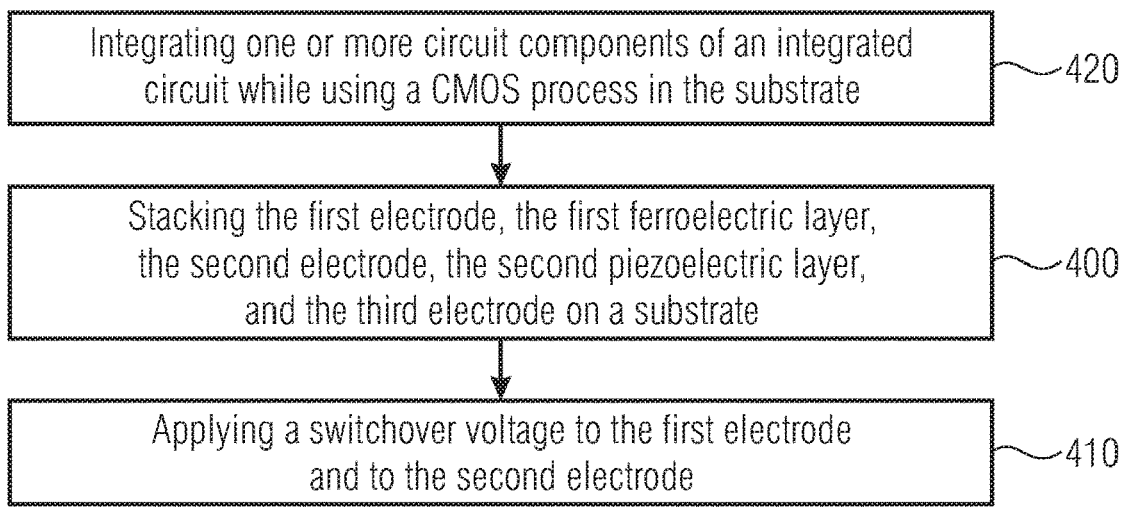
FIG. 10b shows a block diagram of a method of manufacturing a MEMS component, connected to a substrate with an integrated circuit while using a CMOS process, according to an embodiment of the present invention.

FIG. 10b shows a block diagram of a method of manufacturing a MEMS component, connected to a substrate comprising an integrated circuit while using a CMOS process, according to an embodiment of the present invention. The method comprises, in a first step, integrating 420 one or more circuit components of an integrated circuit while using a CMOS process in the substrate. A second step of the method comprises stacking 400 the first electrode, the first ferroelectric layer, the second electrode, the second piezoelectric layer and the third electrode on a substrate. In a further step of the method, a switchover voltage is applied 410 to the first electrode and to the second electrode, the polarization direction of the first ferroelectric layer being reversed so that the polarization direction of the first ferroelectric layer is reversed. The steps of stacking 400 and applying 410 are analogous to the steps of stacking 400 and applying 410 of the method shown in FIG. 9.

The MEMS component of FIG. 10a and FIG. 10b, consisting of the first electrode, the first ferroelectric layer, the second electrode, the second piezoelectric layer and the third electrode, is, for example, the MEMS component 200 of FIG. 3 or the MEMS component 200 of FIG. 4. It is also possible to stack more than three electrode layers and two ferroelectric layers by means of this method, thereby stacking, for example, the MEMS component 200 of FIG. 5, the MEMS component 200 of FIG. 6, the MEMS component 200 of FIG. 7a, the MEMS component 200 of FIG. 7b, the MEMS component 200 of FIG. 7c, the MEMS component 200 of FIG. 8a and/or the MEMS component 200 of FIG. 8b on the substrate. Furthermore, for example, additional non-ferroelectric layers may be stacked on the substrate by means of this method and/or the direction of polarity may be switched, by applying a switchover voltage, in more than only the first ferroelectric layer.

The first ferroelectric layer comprises a ferroelectric material as described herein (but the second piezoelectric layer may or may not comprise a ferroelectric material). The ferroelectric material may, when using $Al_{1-x}Sc_xN$ as an example, be produced at deposition temperatures as low as 400° C. and is therefore, like pure AlN, CMOS-compatible. The high electric strength of pure AlN (>400 V/μm) is also retained in $Al_{1-x}Sc_xN$. The low dielectric losses of usually well below 1% [12] and the possibility of setting the intrinsic mechanical stress of the ferroelectric layers are also retained [11]. The ferroelectric material and its integration, and, thus, the MEMS component, is CMOS-compatible.

Figure 11A:
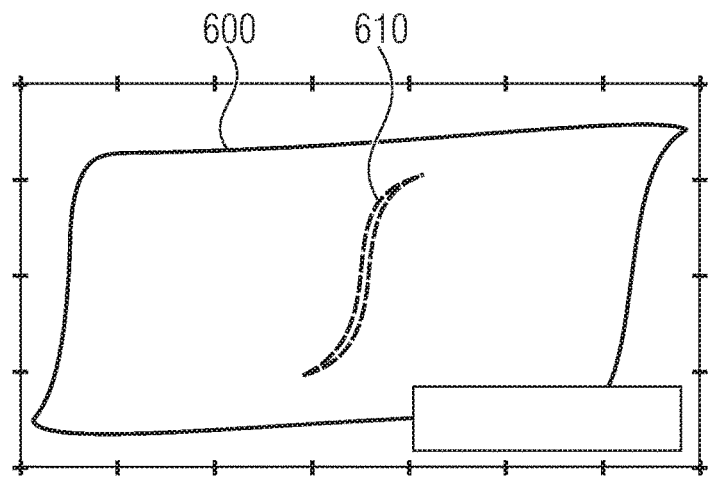
FIG. 11a shows a diagram on the electrical polarization of a ferroelectric material according to an embodiment of the present invention.

FIG. 11a shows a diagram in which the electric polarization across the electric field (P-E loop), measured at the ferroelectric $Al_{0.57}Sc_{0.43}N$ and PZT 52/48, according to an embodiment of the present invention is shown. On the ordinate, the polarization is represented, and on the abscissa, the electric field is represented. A first P-E loop 600 represents the dependence of the polarization on the electric field for the ferroelectric material $Al_{0.57}Sc_{0.43}N$, and a second P-E loop 610 represents the dependence of the electric polarization on an electric field for PZT 52/48. The ferroelectric material $Al_{0.57}Sc_{0.43}N$ is an example of the ferroelectric material consisting of a mixed crystal comprising AlN and at least one nitride of a transition metal, the transition metal in this case being scandium.

Using the example of $Al_{1-x}Sc_xN$ (mixed crystal of AlN and the nitride of the transition metal ScN, an example of the ferroelectric material), it was discovered that mixed crystals consisting of AlN and the nitrides of transition metals are ferroelectric under certain conditions. Ferroelectricity occurs when an external electric field may be used to overcome the energy barrier between two polarization states of a material without first exceeding the breakdown field strength of the material (of the ferroelectric material). The measured breakdown field strength for pure AlN varies widely in literature, with values between 50 V/μm and 600 V/μm. Studies have shown that electrical breakthroughs occur at field strengths >400 V/μm. The field strength at which a spatial change in polarization occurs may be determined by the coercive field strength $E_c$ of a P-E loop. P-E loops represent the polarization P of the material as a function of an exciting electric field E.

Whether a spatial change in polarization is possible below a field strength of 400 V/μm is determined primarily by two factors for the materials under consideration (ferroelectric materials): firstly, by the ratio of the number of Al atoms to the number of transition metal atoms (see FIG. 11c) and secondly, the extent to which the ferroelectric layer is under compressive or tensile stress (see FIG. 11b).

Figure 11B:
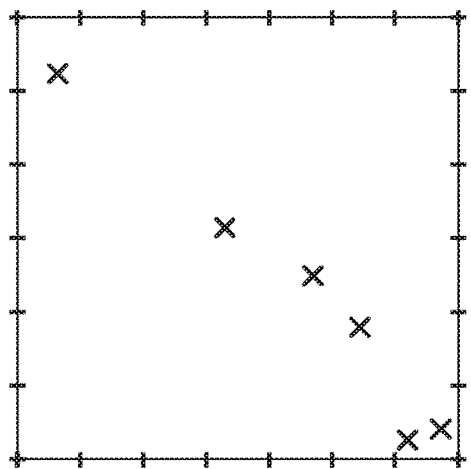
FIG. 11b shows a diagram showing the average amount of the measured coercive field over the mechanical stress of a ferroelectric layer according to an embodiment of the present invention.

In FIG. 11b, the average amount of the measured coercive field $E_c$ across the mechanical stress of an $Al_{0.73}Sc_{0.27}N$ layer in accordance with an example of the present invention is shown. The ordinate of the diagram represents the average amount of the measured coercive field $((E_{c,+}-E_{c,-})/2)$, and the mechanical stress is shown on the abscissa. For layers under high tensile stress (of the ferroelectric material), the Sc fraction (the fraction of the transition metal) that may be used would decrease, in case of compressive stress it would increase. The method of setting the Sc content, the mechanical stress and production of the layers in general were described by the authors in [11, 12]. The ferroelectric material $Al_{0.73}Sc_{0.27}N$ is an example of a ferroelectric material comprising a mixed crystal including AlN and at least one nitride of a transition metal.

Figure 11C:
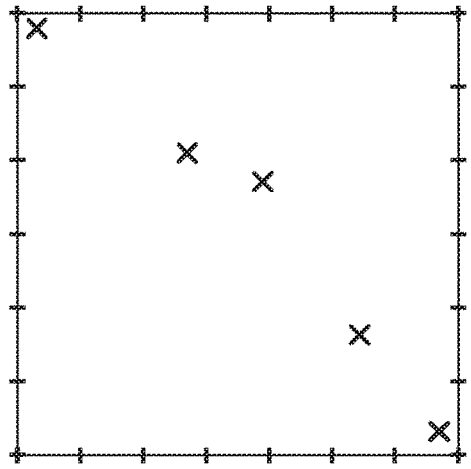
FIG. 11c shows a diagram showing the average amount of the measured coercive field over the Sc content of an AlScN layer according to an embodiment of the present invention.

In a diagram, FIG. 11c shows the average amount of the measured coercive field across the Sc content of the AlScN layer according to an embodiment of the present invention. On the ordinate, the average amount of the measured coercive field $((E_{c,+}-E_{c,-})/2)$ is shown, and on the abscissa, x in $Al_{1-x}Sc_xN$ is shown. The mechanical stress of the ferroelectric layers is typically within the interval [0 200 MPa] (the interval may, however, also range from −1000 MPa to 600 MPa, from −400 MPa to +400 MPa, or from −200 MPa to 200 MPa) and is thus comparable.

Measurements made on $Al_{1-x}Sc_xN$ in this context showed that ferroelectric switching of polarization is possible, for example, from an Sc content of about x=0.27, provided that the mechanical stress of the layers (the ferroelectric layers) is close to the transition from tensile to compressive stress. For ferroelectric layers under stronger tensile stress, the Sc content that may be used would decrease as shown in FIG. 11b, and in the case of compressive stress it would increase. For an $Al_{0.73}Sc_{0.27}N$ layer, for example, the mechanical stress should be within an interval from −300 MPa to 2000 MPa, or from −200 MPa to 1000 MPa, where negative values correspond to compressive stress and positive values to tensile stress. Due to the relationship in FIG. 11c, more compressive stress might be allowed for $Al_{0.64}Sc_{0.36}N$, e.g. mechanical stress within an interval from −600 MPa to 2000 MPa or from −500 MPa to 1000 MPa.

Figure 12:
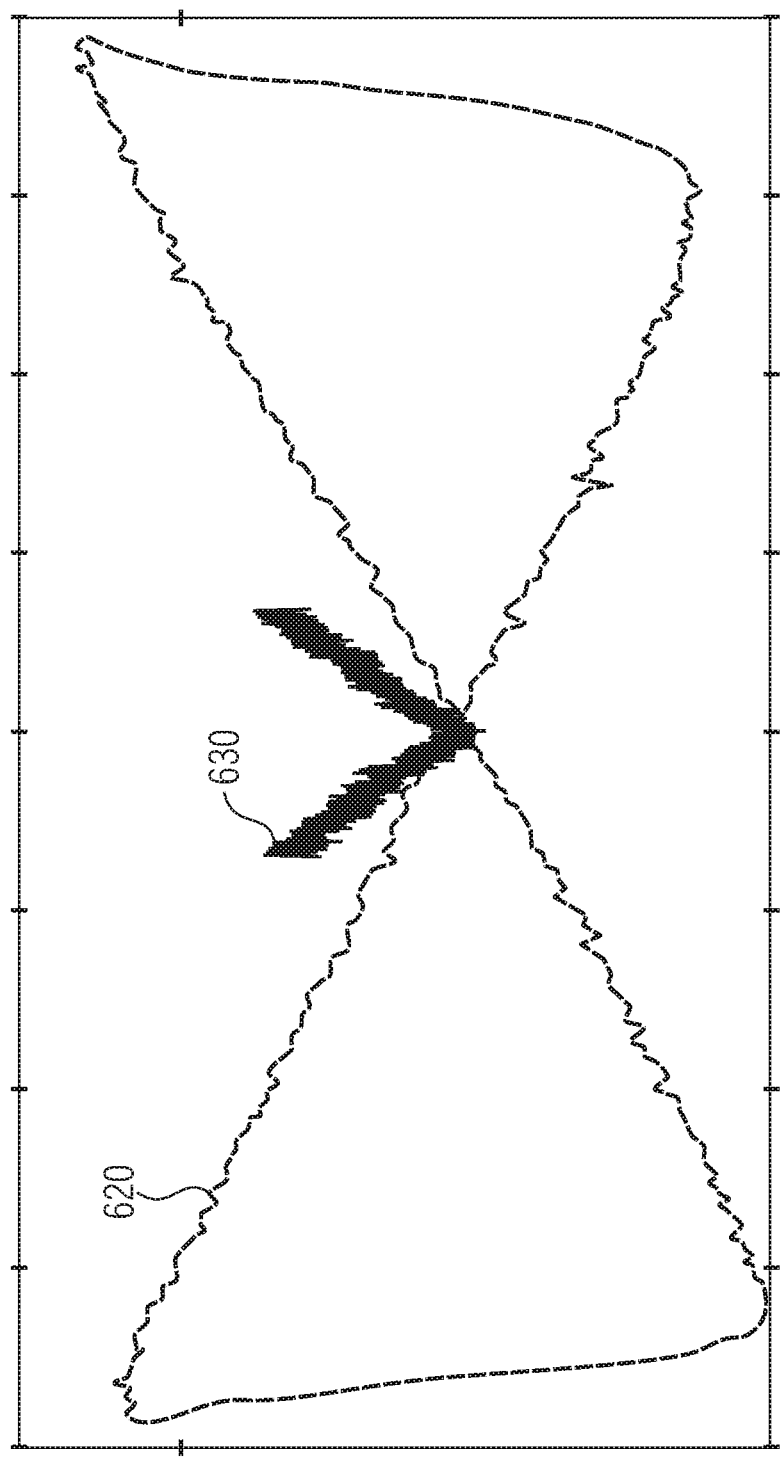
FIG. 12 shows a diagram of the ferroelectric force of a ferroelectric layer with an electrode surface according to an embodiment of the present invention.

FIG. 12 shows a diagram in which the piezoelectric force, which acts perpendicularly to the substrate, with an electrode surface area of 1 mm² for ferroelectric $Al_{0.57}Sc_{0.43}N$ (example of a ferroelectric material) and PZT (example of a ferroelectric material of conventional technology which is not CMOS-compatible and highly non-linear and also has a low breakdown voltage) is shown in comparison according to an embodiment of the present invention. The force is plotted on the ordinate, and the electric field is plotted on the abscissa. The ferroelectric force was calculated from the elongation of the layers measured by laser double beam interferometry. A first curve 620 shows the force behavior against the electric field of the ferroelectric AlScN, and a second curve 630 shows the dependence of the force on the electric field for the PZT material.

Another outstanding property of the ferroelectric material is a very large range within which the force resulting from an applied electric field is linear to said field (see the first curve 620 of FIG. 12). As a result, a linear, bipolar drive with high field strengths of >50 V/µm is possible. The ferroelectric material has a wide range within which the relationship between the electric field and the resulting force is linear (the same applies to n-layer actuators based on the material). This allows operation with bipolar electric voltages within the very wide range between the coercivity fields $E_{c−}$ and $E_{c+}$.

Figure 13C:
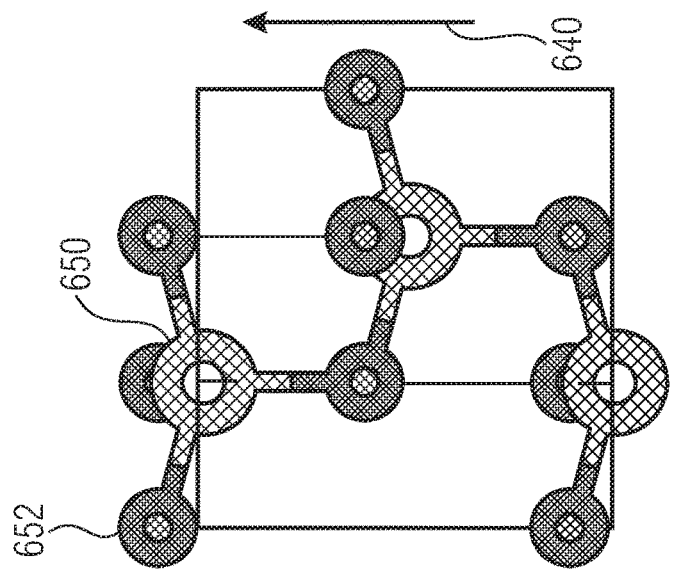
FIG. 13c shows a schematic representation of a unit cell of a wurtzite of a ferroelectric material having a positive polarity according to an embodiment of the present invention.
Figure 13B:
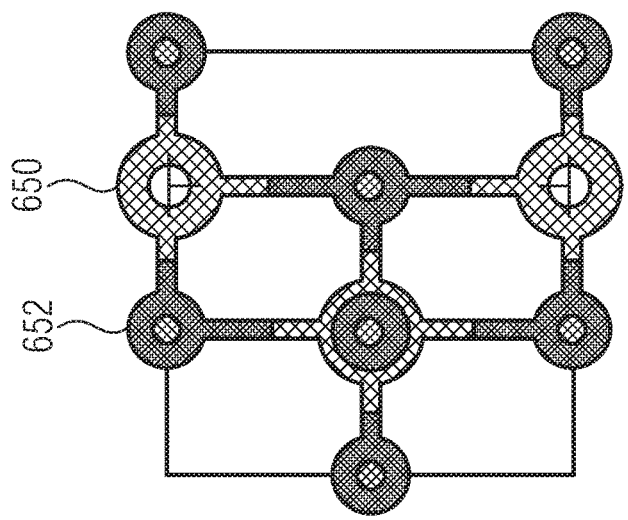
FIG. 13b shows a schematic representation of a unit cell of a hexagonal structure of a ferroelectric material having no polarity according to an embodiment of the present invention.
Figure 13A:
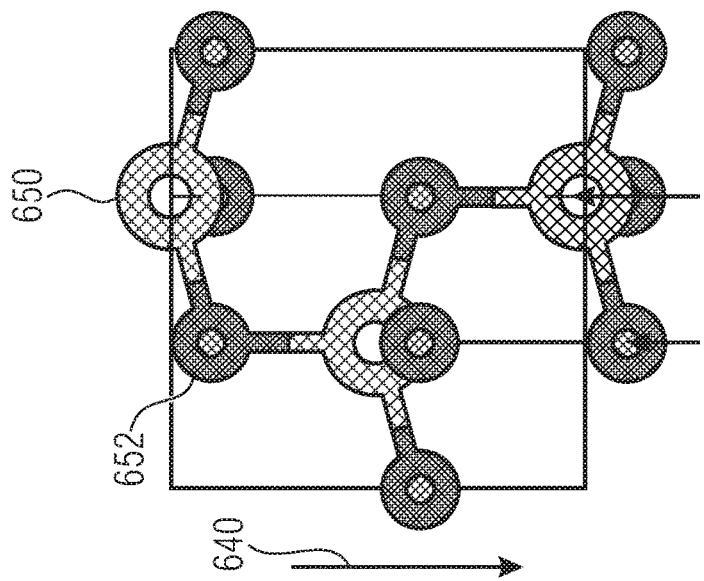
FIG. 13a shows a schematic representation of a unit cell of a wurtzite of a ferroelectric material having a negative polarity according to an embodiment of the present invention.

FIG. 13a and FIG. 13c show a schematic representation of a unit cell of a wurtzite while using the example of $Al_{1-x}Sc_xN$, and FIG. 13b shows a schematic representation of a unit cell of a hexagonal structure while using the example of $Al_{1-x}Sc_xN$ according to an embodiment of the present invention. The electrical polarization P 640 is arranged in parallel with the c axis (optical axis) of the crystal. Depending on the relative position of the metal 650 and nitrogen 652 planes to each other, the sign of the polarization 640 changes. In FIG. 13a, the unit cell has a negative polarization 640, in FIG. 13b both planes (metal 650 and nitrogen 652 planes) are congruent (hexagonal structure), whereby the electrical polarization disappears, and in FIG. 13c, the polarization 640 is positive.

The reason for the ferroelectric behavior discovered may be traced by means of published theoretical calculations [19]: As a result of an increasing proportion, for example of Sc in $Al_{1-x}Sc_xN$, the Wurtzite crystal structure of AlN energetically approaches a hexagonal phase, i.e. a structure in which metal and nitrogen atoms are arranged within one plane (see FIG. 13b). This structure may serve as a transition structure between the two possible polarization directions (see FIG. 13a and FIG. 13c) of the wurtzite structure.

The prerequisite for this is that by selecting a corresponding transition metal proportion and a corresponding mechanical stress of the material, the two crystal structures are sufficiently close to each other energetically to overcome the energy maximum of the hexagonal structure by means of an electric field that is counter to the polarization direction. The polarization is then immediately switched in the direction of the field. This switching process is reversible by reversing the electric field. The material is thus ferroelectric.

This mechanism has previously been calculated only theoretically for GaScN [19]. However, it is highly probable that the same effect is responsible for the ferroelectric behavior of the AlN-based mixed crystals that have been studied. In addition to mixed crystals of AlN and ScN, compositions with the nitrides of other transition metal elements such as YN, TiN, NbN or CrN, for example, or mixtures of these are also conceivable.

Ferroelectric materials are characterized by a spatially rotatable electric polarization P, the direction of which may be determined by an external electric field E. Depending on the orientation of the polarization with respect to the effective electric field, the material additionally expands or contracts (piezoelectric effect). This effect may be used in actuators. In microsystem technology, for example, a plate capacitor comprising a ferroelectric dielectric is deposited, to this end, on a passive layer and structured (see FIG. 14a).

Figure 14A:
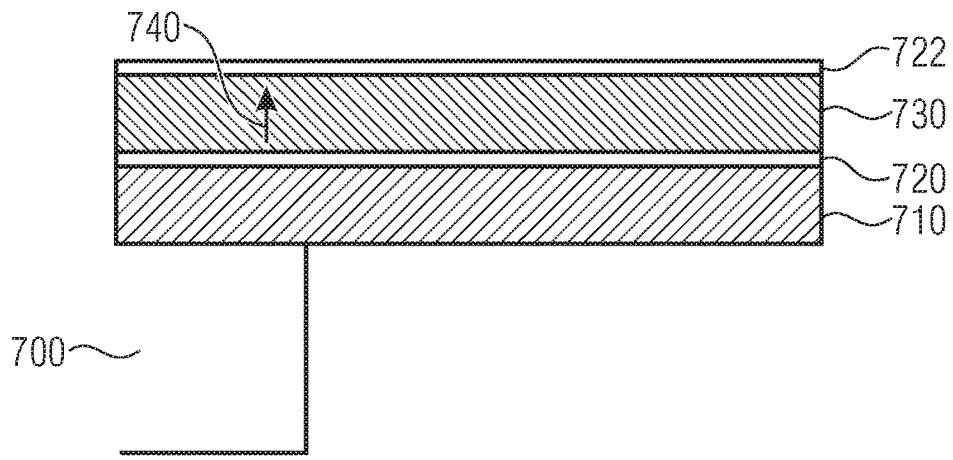
FIG. 14a shows a schematic representation of a ferroelectric actuator in accordance with conventional technology.

FIG. 14a shows a substrate 700 on which a passive layer 710 having a first electrode 720 is deposited according to an embodiment of the present invention. A ferroelectric layer 730 comprising a second electrode 722 is deposited on the first electrode 720. The layer 730 has a polarity 740. This setup may also be implemented with the ferroelectric material described herein within the ferroelectric layer 730.

In other words, FIG. 14a shows a sketch of a piezoelectric actuator consisting of a parallel-plate capacitor with a ferroelectric dielectric (ferroelectric layer 730) on a passive layer 710. The passive layer 710 may be the membrane of an ultrasonic transducer or that of a loudspeaker, for example.

Figure 14B:
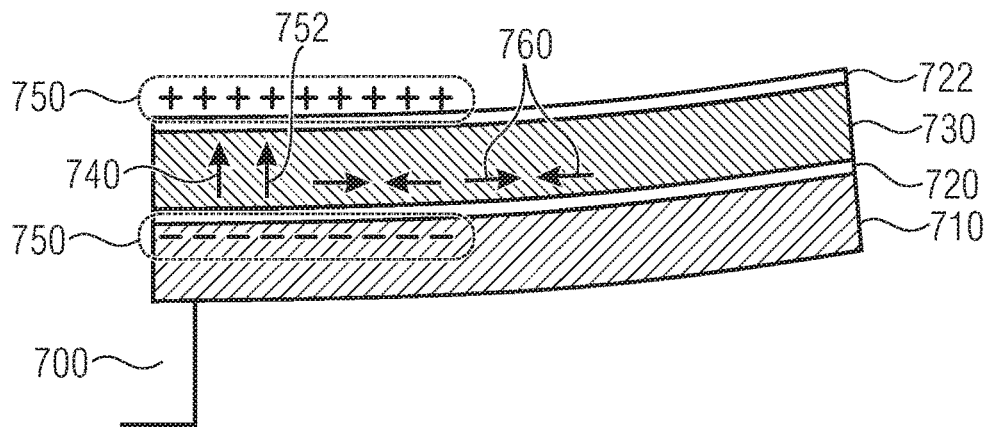
FIG. 14b shows a schematic representation of a ferroelectric actuator having a positive external electric field applied to it, in accordance with conventional technology.
Figure 14C:
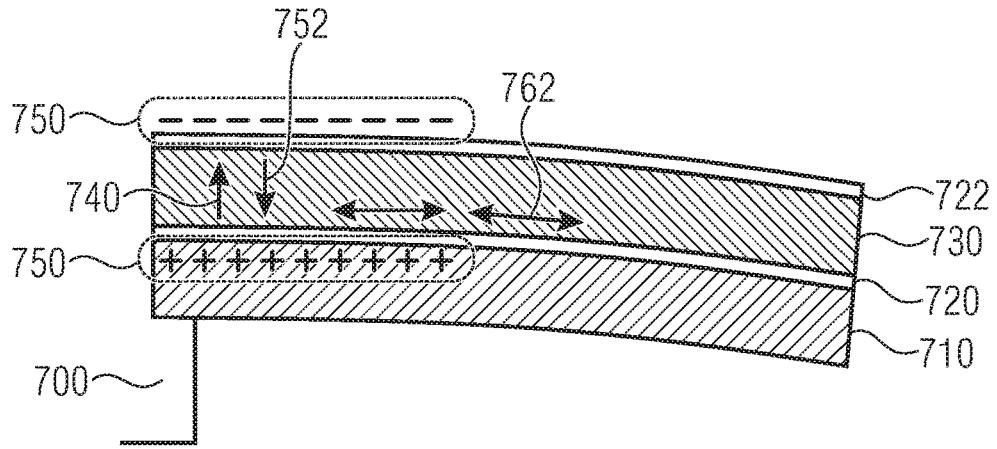
FIG. 14c shows a schematic representation of a ferroelectric actuator having a negative external electric field applied to it, in accordance with conventional technology.

FIG. 14b and FIG. 14c also show an example of using a ferroelectric layer as an actuator according to an embodiment of the present invention. The same setup as in FIG. 14a (substrate 700, passive layer 710, first electrode 720, ferroelectric layer 730 and second electrode 722) is used. Both the ferroelectric layer 730 of FIG. 14b and the ferroelectric layer 730 of FIG. 14c have a positive polarity 740. In FIG. 14b, however, different voltages are applied to the first electrode 720 and the second electrode 722 than are applied to the first electrode 720 and the second electrode 722 of FIG. 14c, which results in an electric field 750, comprising an electric field direction 752, in FIG. 14b that is different from the electric field 750, comprising the electric field direction 752, in FIG. 14c.

In FIG. 14b, the polarity 740 of the ferroelectric layer 730 is rectified to the electric field direction 752, causing the ferroelectric layer 730 to undergo compression 760.

In FIG. 14c, the polarity 740 of the ferroelectric layer 730 is opposite to the electric field direction 752, causing the ferroelectric layer 730 to undergo elongation 762.

As a result of the transverse contraction (compression) or expansion (elongation) of the ferroelectric material when a voltage U is applied, a compressive or tensile stress is generated within the substrate 700, depending on the direction of polarization 740, thus deforming said substrate 700 (see FIG. 14b and FIG. 14c). The mechanical force underlying the deformation is caused by the piezoelectric coefficients of the material (of the ferroelectric material), its polarization direction 740 and the available electrical voltage [1].

FIG. 14b and FIG. 14c show examples of using a ferroelectric layer as a actuator of conventional technology, which may also be applied to the ferroelectric material described herein. In other words, FIG. 14b and FIG. 14c describe that the ferroelectric layer 730 will deform as a result of an external electric field 750. Depending on the orientation of the electric field 750 (electric field direction 752) to material polarization, either an elongation (see FIG. 14c, elongation 762) or a compression (see FIG. 14b, compression 760) of the active layer (the ferroelectric layer 730) occurs, which as a result compresses or elongates the passive layer 710, since both are mechanically coupled. The ferroelectric layer 730 is coupled to the passive layer 710.

One way to increase the force for a fixed electrical voltage is to use a multilayer system. When using n-layers of a ferroelectric material exhibiting ferroelectric coefficients identical in amount, above which the available electrical voltage is applied, the resulting force may be increased by up to a factor of n [2].

Figure 15A:
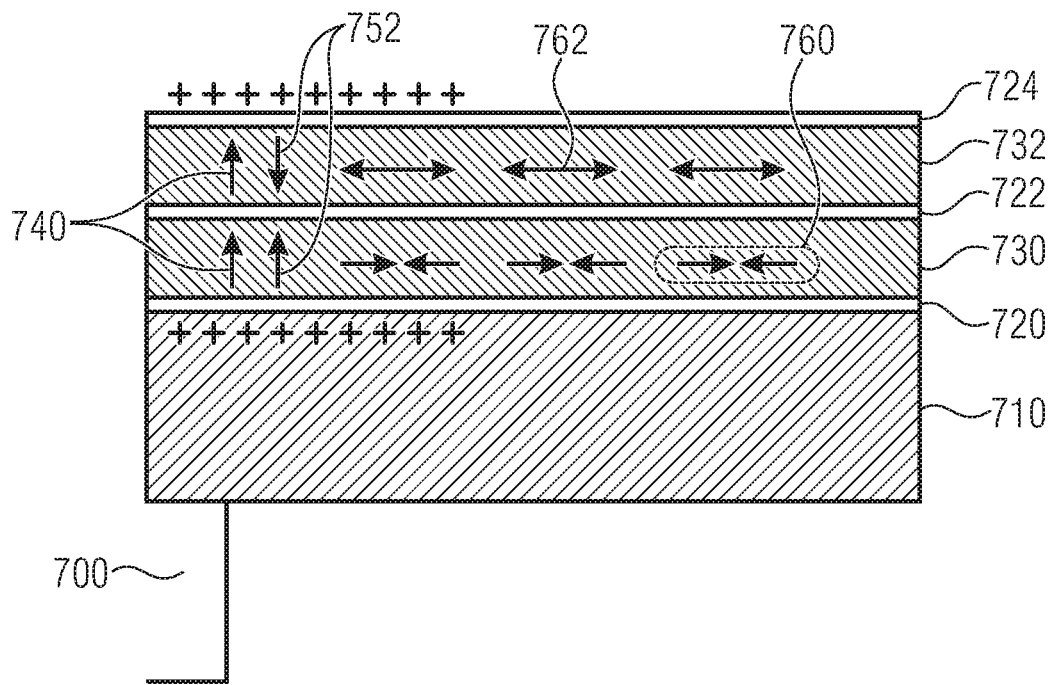
FIG. 15a shows a schematic representation of a ferroelectric double-layer actuator without deflection in accordance with conventional technology.
Figure 15B:
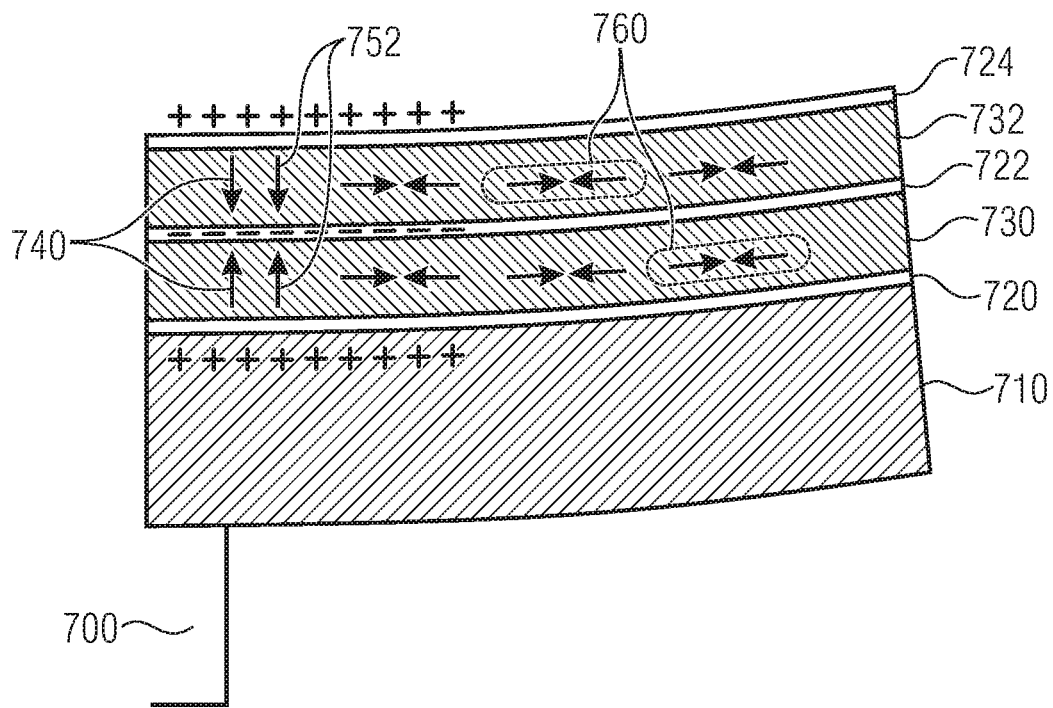
FIG. 15b shows a schematic representation of a ferroelectric double-layer actuator which is deflected in accordance with conventional technology.

In FIG. 15a and FIG. 15b, a ferroelectric multilayer system is depicted according to an embodiment of the present invention. The ferroelectric multilayer system comprises a substrate 700, a passive layer 710, a first electrode 720, a second electrode 722, a third electrode 724, a first ferroelectric layer 730 and a second ferroelectric layer 732.

In FIG. 15a, in the first ferroelectric layer 730, the polarization 740 is rectified to the electric field direction 752, whereby the first ferroelectric layer 730 undergoes compression 760, and in the second ferroelectric layer 732, the polarization 740 is opposite to the electric field direction 752, whereby the second ferroelectric layer 732 undergoes an elongation 762. Thus, the elongation 762 of the second ferroelectric layer 732 is cancelled out by the compression 760 of the first ferroelectric layer 730 in such a way that no change in the passive layer 710 occurs. FIG. 15a thus illustrates the significance of checking polarization of the ferroelectric layers in the design shown.

In FIG. 15b, h the polarization 740 of the first ferroelectric layer 730 is rectified to the electric field direction 752, and the polarization 740 of the second ferroelectric layer 732 is rectified to the electric field direction 752. Thus, both the first ferroelectric layer 730 and the second ferroelectric layer 732 undergo compression 760.

In other words, FIG. 15a and FIG. 15b show a scheme of a simple piezoelectric double-layer actuator consisting of two plate capacitors with a common electrode 722. It is assumed that the neutral plane lies within the passive layer 710.

In FIG. 15a, both ferroelectric layers have an identical polarization direction 740. As a result of the acting forces F (compression 760 and elongation 762), the upper layer (the second ferroelectric layer 732) should expand, and the lower layer (the first ferroelectric layer 730) should compress. In total, the two effects (compression 760 and elongation 762) cancel each other out to a large extent, no movement is induced.

In FIG. 15b, the two ferroelectric layers (the first ferroelectric layer 730 and the second ferroelectric layer 732) are oppositely polarized 740. Thus, both are compressed as a result of the external electric field. When assuming the same electrical voltage, twice the force of a single layer thus acts on the passive layer.

The two designs of a double layer actuator as shown in FIG. 15a and FIG. 15b are known from conventional technology, but may also be applied to the invention described herein. For example, the first ferroelectric layer 730 and the second ferroelectric layer 732 of FIG. 15a and FIG. 15b may comprise the ferroelectric material.

Figure 16:
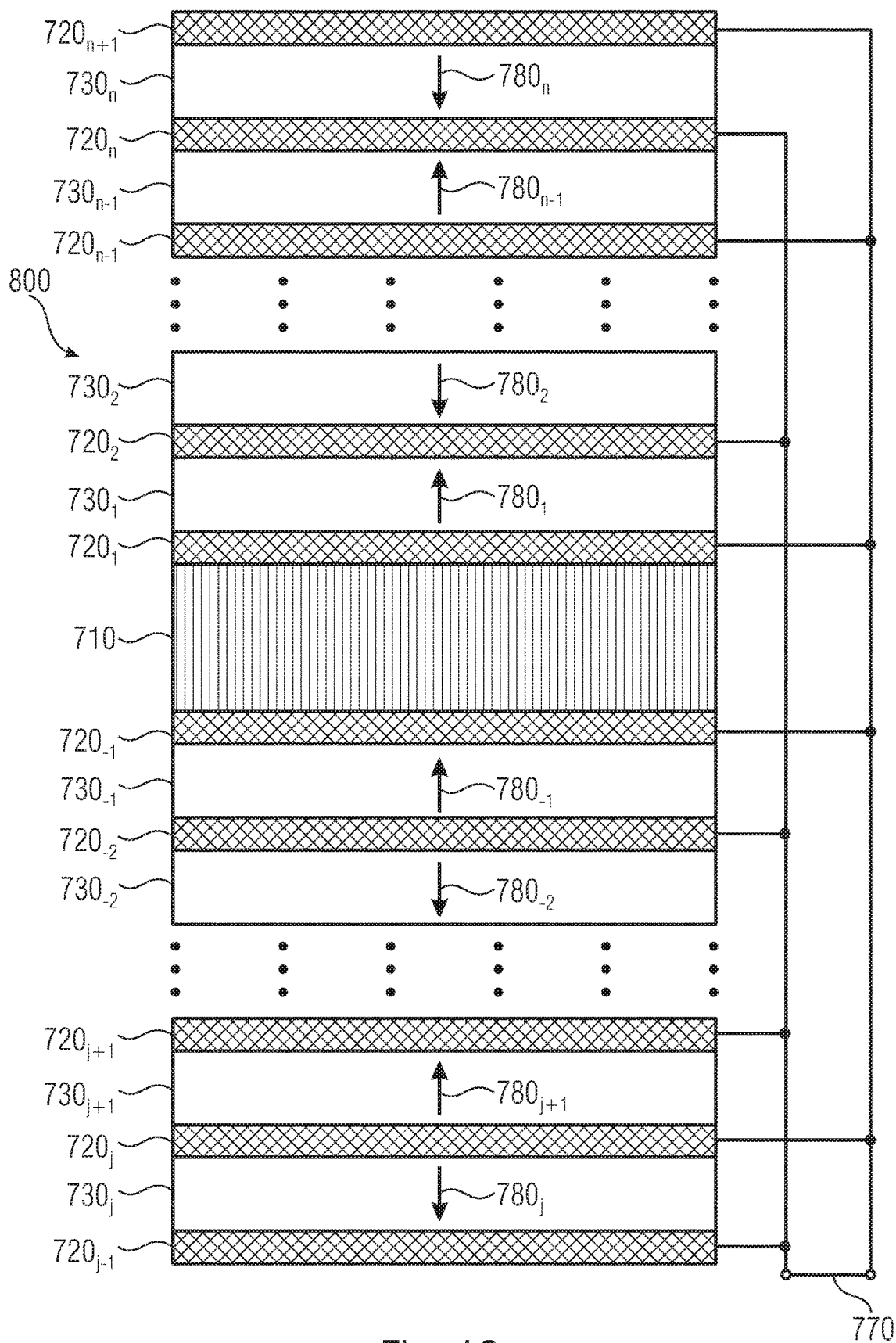
FIG. 16 shows a schematic representation of a multilayer actuator manufactured by means of classical ferroelectrics in accordance with conventional technology.

FIG. 16 shows a possible implementation of a ferroelectric multilayer actuator according to an embodiment of the present invention. The multilayer actuator 800 has a passive layer 710, ferroelectric layers $730_j$ to $730_n$, electrodes $720_{j-1}$ to $720_{n+1}$ and a power supply 770. FIG. 16 shows a possible sequence of layers of a ferroelectric multilayer actuator with alternately aligned polarization $780_j$ to $780_n$ (n to j ferroelectric layers, j<0, n>0). In the case of ferroelectrics, after applying a sufficiently large electric field, all active polarization domains (polarization $780_j$ to $780_n$) are aligned along the applied electric field. What is shown here is an implementation with active ferroelectric layers $730_j$ to $730_n$ on both sides of a passive layer 710. In general, the passive layer 710 may also be dispensed with or coated on one side only (e.g. j=0). In any case, the acting force of ferroelectric layers $730_j$ to $730_n$ above the neutral plane (located within the passive layer 710) may be opposite in sign to that of the layers below, in order to avoid possible compensation of the respective forces. An example of a classic ferroelectric that may be used in this embodiment is PZT. The embodiment of a multilayer actuator 800 that is described in FIG. 16 may also be implemented for the ferroelectric material described herein (consisting of a mixed crystal comprising AlN and at least one nitride of a transition metal) in that at least one of the ferroelectric layers $730_j$ to $730_n$ comprises the ferroelectric material.

Ferroelectrics such as $Al_{1-x}Sc_xN$, for example, may be combined, without additional insulating layers, to form effective multilayer actuators as shown in FIG. 16, since this class of materials has an inherent alignment of its electrical polarization along the field direction of external electric fields. According to the electrical contacting of the individual electrodes $720_{j-1}$ to $720_{n+1}$ that is shown in FIG. 16, all ferroelectric layers $730_j$ to $730_n$ thus contribute to the total force with the ideal sign. In addition to the possibility of providing both sides of a passive layer 710 with active ferroelectric layers $730_j$ to $730_n$, it may be advantageous for the sake of simplicity to coat these only on one side (j=0) or to design the structure exclusively from a ferroelectric multilayer together with electrodes $720_{j-1}$ to $720_{n+1}$, i.e. without any passive layer 710. In any case, the position of the neutral plane may be taken into account in the selection of suitable polarization $780_j$ to $780_n$. Layers above this plane have to couple their force in with the opposite sign, as goes for layers below.

Figure 17:
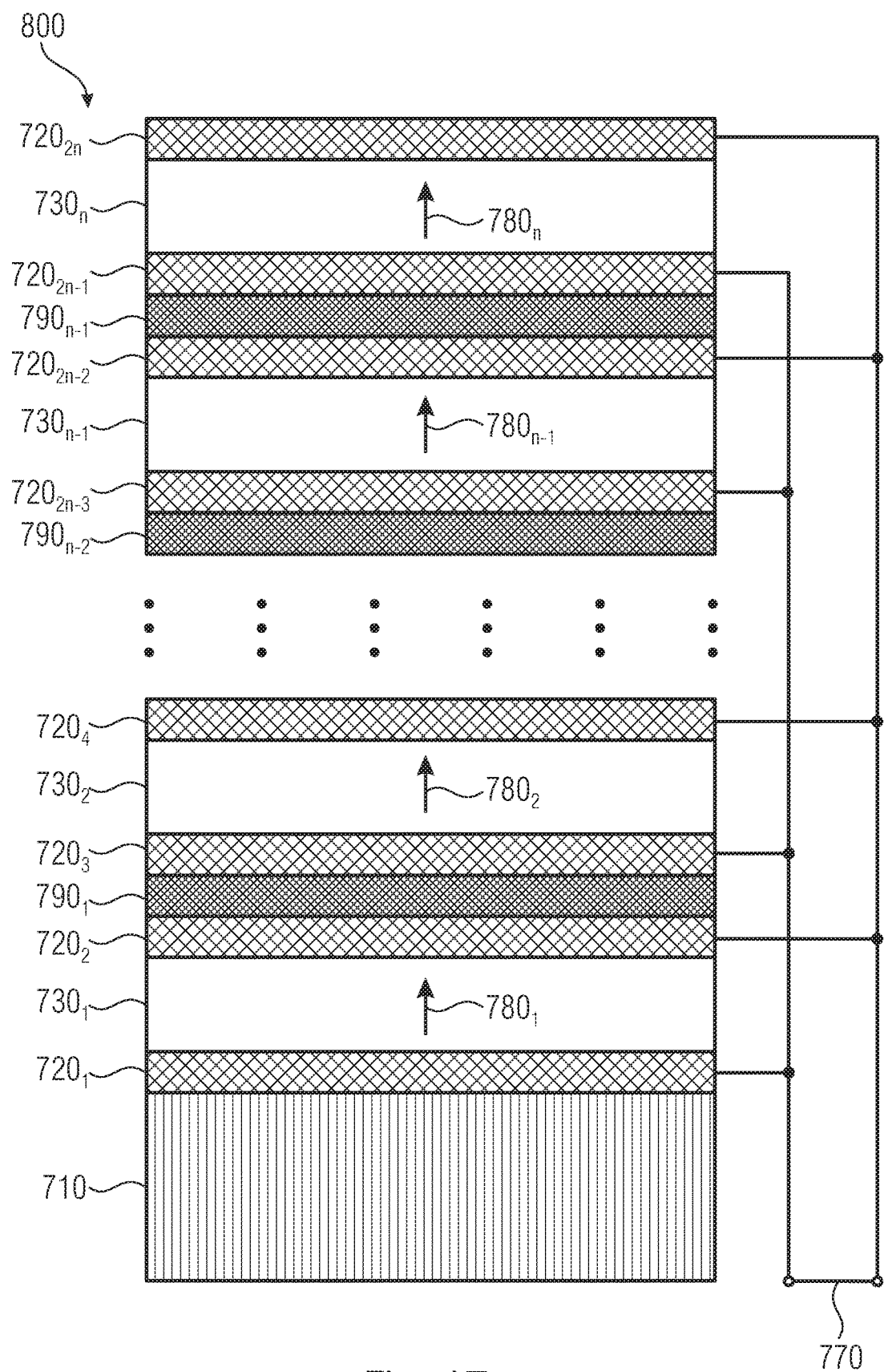
FIG. 17 shows a schematic representation of a multilayer actuator when using non-ferroelectric pyroelectrics in accordance with conventional technology.

FIG. 17 shows an implementation of a possible sequence of layers of a piezoelectric multilayer actuator 800 by means of electrically insulated individual layers according to an embodiment of the present invention. The multilayer actuator 800 has a passive layer 710, piezoelectric layers $730_1$ to $730_n$, electrodes $720_1$ to $720_{2n}$, insulators $790_1$ to $790_{n-1}$ and a power supply 770. Insulation with the insulator $790_1$ to $790_{n-1}$ allows the efficient use of non-ferroelectric pyroelectrics (such as AlN) whose polarization $780_1$ to $780_n$ each point in the same direction. For simplicity's sake, only the case of a passive layer 710 coated on one side is shown. In principle, all discussed principles (passive layer coated on two sides, without passive layer) may be implemented with additional insulators $790_1$ to $790_{n-1}$.

Since the polarization $780_1$ to $780_n$ of non-ferroelectric pyroelectrics, such as AlN, cannot be subsequently changed, it is defined solely during the manufacture of the material. In multilayer systems produced by one and the same process, polarization of all layers (all piezoelectric layers $730_1$ to $730_n$) thus points in the same direction, ideally perpendicular to the substrate (to the passive layer 710). To ensure effective drive, the exciting electric field may therefore also point in the same direction for all individual layers. It is therefore useful to electrically separate the individual capacitor structures of the multilayers (see FIG. 17). Even if the multilayer actuator 800 of FIG. 17, as known from conventional technology, has disadvantages as compared to the use of ferroelectrics (such as the significance of using at least two additional layers, namely an insulator and a further electrode per ferroelectric layer), the multilayer actuator 800 may nevertheless also be an embodiment of the invention described herein. This is achieved in that at least one of the piezoelectric layers $730_1$ to $730_n$ comprises the ferroelectric material.

Figure 18:
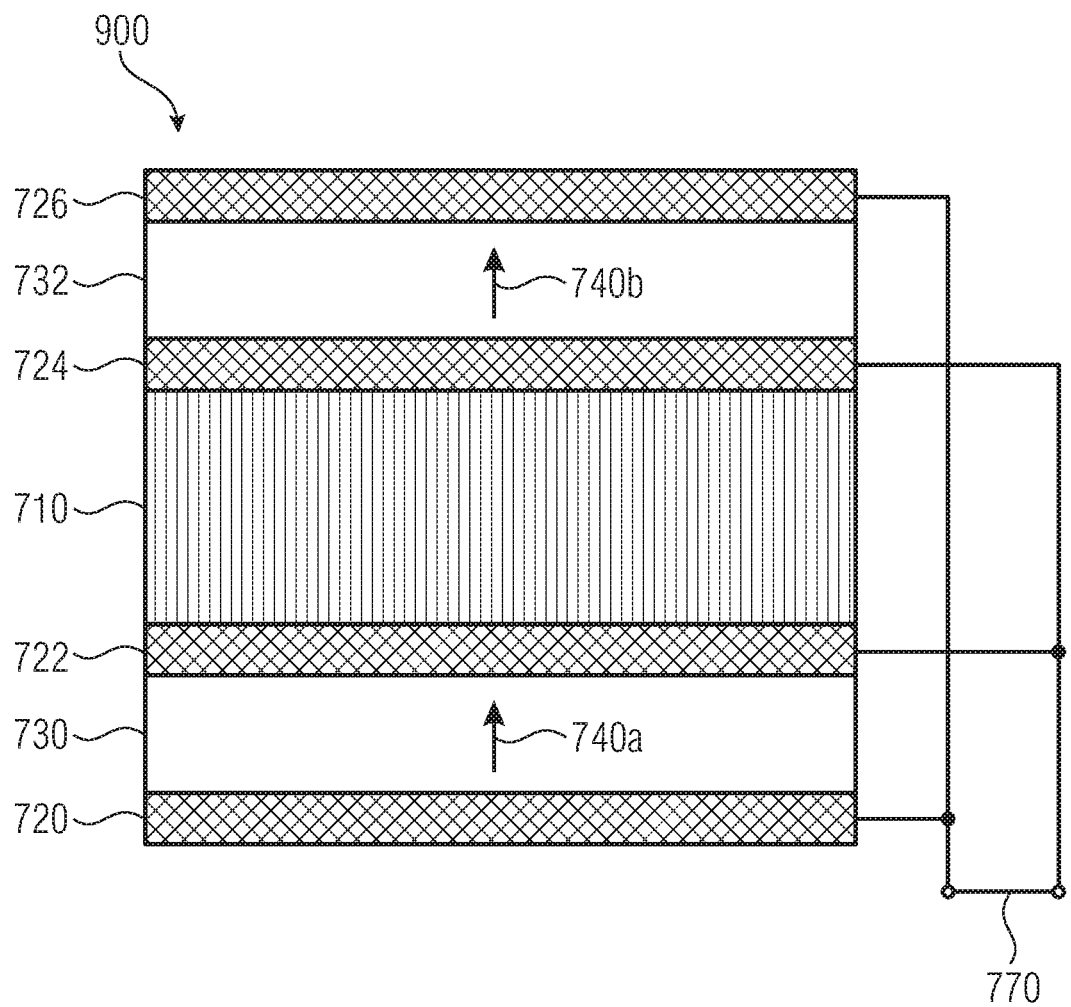
FIG. 18 shows a schematic representation of a layer sequence of a ferroelectric bimorph in accordance with conventional technology.

FIG. 18 shows an implementation of a possible sequence of layers of a piezoelectric bimorph 900 according to an embodiment of the present invention. The bimorph 900 has a passive layer 710, a first piezoelectric layer 730, a second piezoelectric layer 732, a first electrode 720, a second electrode 722, a third electrode 724, a fourth electrode 726 and a power supply 770. The passive layer 710 is optional. The number of piezoelectric layers is limited to n=2, and both the first piezoelectric layer 730 has a polarity 740a and the second piezoelectric layer 732 has a polarity 740b. This sequence of layers of a piezoelectric bimorph has already been used, for example, for AlN in accordance with conventional technology. However, it is also possible that the ferroelectric material as described herein is used. Thus, the bimorph 900 of FIG. 18 may also be an embodiment according to the invention described herein, in that at least one of the two piezoelectric layers (the first piezoelectric layer 730 and/or the second piezoelectric layer 732) comprise(s) the ferroelectric material having a mixed crystal comprising AlN and at least one nitride of a transition metal.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] T. Ikeda,"Fundamentals of Piezoelectricity", Oxford University Press, 1990.
[2] R. G. Ballas, "Piezoelectric Multilayer Beam Bending Actuators", Springer, 2007.
[3] C. Randall, A. Kelnberger, G. Y. Yang, R. E. Eitel, and T. R. Shrout, "High Strain Piezoelectric Multilayer Actuators: A Material Science and Engineering Challenge," J. Electroceramics, vol. 14, no. 3, pp. 177-191, 2005.
[4] L. M. Sanchez, A. D. Grobicki, G. L. Smith, J. S. Pulskamp, I. Takeuchi, and R. G. Polcawich, "Texture control in lead zirconate titanate multilayer thin films," IEEE Trans. Ultrason. Ferroelectr. Freq. Control, vol. 61, no. 4, pp. 654-661, 2014.
[5] N. R. Harris et al., "A multilayer thick-film PZT actuator for MEMs applications," Sensors Actuators, A Phys., vol. 132, no. 1 SPEC. ISS., pp. 311-316, 2006.
[6] Y. Lu, A. Heidari, and D. A. Horsley, "A High Fill-Factor Annular Array of High Frequency Piezoelectric Micromachined Ultrasonic Transducers," J. Microelectromechanical Syst., vol. 24, no. 4, pp. 904-913, 2015.
[7] N. Sinha et al., "Piezoelectric aluminum nitride nanoelectromechanical actuators," Appl. Phys. Lett., vol. 95, no. 5, 2009.
[8] E. Milyutin et al., "Sputtering of (001)AlN thin films: Control of polarity by a seed layer," J. Vac. Sci. Technol. B Microelectron. Nanom. Struct., vol. 28, no. May, p. L61, 2010.
[9] M. Akiyama, T. Kamohara, K. Kano, A. Teshigahara, and N. Kawahara, "Influence of oxygen concentration in sputtering gas on piezoelectric response of aluminum nitride thin films," Appl. Phys. Lett., vol. 93, no. 2, pp. 6-9, 2008.
[10] T. Mizuno et al., "Germanium Aluminium Nitride thin films for piezo-MEMS devices," Transducers, Taiwan, 2017.
[11] S. Fichtner, T. Reimer, S. Chemnitz, F. Lofink, and B. Wagner, "Stress controlled pulsed direct current co-sputtered $Al_{1-x}Sc_xN$ as piezoelectric phase for micromechanical sensor applications," APL Mater., vol. 3, no. 11, 2015.
[12] S. Fichtner et al., "Identifying and overcoming the interface originating c-axis instability in highly Sc enhanced AlN for piezoelectric micro-electromechanical systems," J. Appl. Phys., vol. 122, no. 3, p. 35301, 2017.
[13] M. Akiyama, T. Kamohara, K. Kano, A. Teshigahara, Y. Takeuchi, and N. Kawahara, "Enhancement of piezoelectric response in scandium aluminum nitride alloy thin films prepared by dual reactive cosputtering," Adv. Mater., vol. 21, no. 5, pp. 593-596, 2009.
[14] M. Akiyama et al., "Piezoelectric thin film, piezoelectric material, and fabrication method of piezoelectric thin film and piezoelectric material, and piezoelectric resonator, actuator element, and physical sensor using piezoelectric thin film," U.S. Pat. No. 7,758,979B2, 2010.
[15] P. M. Mayrhofer et al., "Microstructure and piezoelectric response of YxAl1-xN thin films," Acta Mater., vol. 100, pp. 81-89, 2015.
[16] A. Zukauskaite et al., "YxAl1-xN thin films," J. Phys. D. Appl. Phys., vol. 45, no. 42, p. 422001, 2012.
[17] V. V. Felmetsger and M. K. Mikhov, "Reactive sputtering of highly c-axis textured Ti-doped AlN thin films," IEEE Int. Ultrason. Symp. /US, pp. 782-785, 2012.
[18] E. Iborra, J. Capilla, J. Olivares, M. Clement, and V. Felmetsger, "Piezoelectric and electroacoustic properties of Ti-doped AlN thin films as a function of Ti content," IEEE Int. Ultrason. Symp. /US, pp. 2734-2737, 2012.
[19] S. Zhang, D. Holec, W. Y. Fu, C. J. Humphreys, and M. A. Moram, "Tunable optoelectronic and ferroelectric properties in Sc-based III-nitrides," J. Appl. Phys., vol. 114, no. 13, 2013.
[20] F. Senger et al., "Mikromechanisches Bauteil und Verfahren zur Herstellung eines piezoelektrischen mikromechanischen Bauteils", DE102015213714A1, 2015.
[21] D. J. Meyer et al., "Method for Fabricating Suspended MEMS Structures", US20160304340A1, 2015.
[22] A. R. Clerici et al., "MEMS-Leiterplattenmodul mit integrierter piezoelektrischer Struktur sowie Schallwandleranordnung", DE102015116640A1, 2015.
[23] A. R. Clerici et al., "Mikro-elektromechanischer Schallwandler mit schallenergiereflektierender Zwischenschicht", DE102013114826A1, 2013.
[24] N. Singh et al., "device arrangement", WO2017/065691A1, 2015.
[25] M. Akiyama et al., "Piezoelektrischer dünner Film, piezoelektrisches Material und Herstellungsverfahren für piezoelektrischen dünnen Film und piezoelektrisches Material, und piezoelektrischer Resonator, Schalterelement und physikalischer Fühler, die piezoelektrischen dünnen Film verwenden", DE102008025691A1, 2008

The invention claimed is:
1. Ferroelectric material; comprising
a mixed crystal comprising AlN and at least one nitride of a transition metal;
wherein the proportion of the nitride of the transition metal is selected such that a direction of an initial or spontaneous polarity of the ferroelectric material is switchable by applying a switchover voltage, the switchover voltage being below a breakdown voltage of the ferroelectric material.

2. Ferroelectric material as claimed in claim 1, the ferroelectric material comprising a mechanical stress that lies between a first value of a compressive stress and a second value of a tensile stress, wherein an absolute value of the first value is lower than an absolute value of the second value.

3. Ferroelectric material as claimed in claim 2, wherein the mechanical stress lies within an interval of −600 MPa to 2000 MPa, wherein negative values represent compressive stress and positive values represent tensile stress.

4. Ferroelectric material as claimed in claim 1, wherein the direction of polarity of the ferroelectric material is maintained after removal of the applied switchover voltage.

5. Ferroelectric material as claimed in claim 1, wherein the ratio of a number of transition metal atoms to a sum of the number of transition metal atoms and a number of aluminum atoms ranges between greater than or equal to 0.2 and less than or equal to 0.5.

6. Ferroelectric material as claimed in claim 1, wherein the transition metal comprises scandium, yttrium, titanium, niobium and/or chromium.

7. Method comprising:
providing a mixed crystal exhibiting an initial or spontaneous polarity, wherein the mixed crystal comprises AlN and at least one nitride of a transition metal,
wherein the proportion of the nitride of the transition metal is selected such that a direction of the initial or spontaneous polarity of the ferroelectric material is switchable by applying a switchover voltage, the switchover voltage being below a breakdown voltage of the ferroelectric material; and
applying a switchover voltage to the mixed crystal, so that the direction of the initial or spontaneous polarity of the mixed crystal is reversed.

8. MEMS component comprising a ferroelectric material as claimed in claim 1.

9. MEMS component as claimed in claim 8, comprising
a first ferroelectric layer comprising the ferroelectric material,
a first electrode disposed on a first surface of the first ferroelectric layer, and
a second electrode disposed on a second surface of the first ferroelectric layer, the second surface being opposite the first surface.

10. MEMS component as claimed in claim 9, comprising
a second ferroelectric layer disposed on the first electrode opposite the first ferroelectric layer, and
a third electrode disposed on a first surface of the second ferroelectric layer, the first surface of the second ferroelectric layer being disposed to face away from the first electrode.

11. MEMS component as claimed in claim 10, wherein the first electrode comprises a first electrode layer and a second electrode layer, and
wherein an insulating layer in which a neutral plane lies is disposed between the first and second electrode layers.

12. MEMS component as claimed in claim 10, wherein the first electrode comprises a first electrode layer and a second electrode layer, and
wherein a passive layer in which a neutral plane lies is disposed between the first and second electrode layers.

13. MEMS component as claimed in claim 10, comprising
a third ferroelectric layer disposed at the third electrode, opposite the second ferroelectric layer,
a fourth electrode disposed on a first surface of the third ferroelectric layer, the first surface of the third ferroelectric layer being disposed to face away from the third electrode,
a fourth ferroelectric layer disposed on the second electrode, opposite the first ferroelectric layer, and
a fifth electrode disposed on a first surface of the fourth ferroelectric layer to face away from the second electrode.

14. MEMS component as claimed in claim 9, comprising a passive layer disposed on the second electrode.

15. MEMS component as claimed in claim 12, wherein the passive layer is connected to a substrate at least on one side.

16. MEMS component as claimed in claim 8, wherein the MEMS component comprises a multilayer MEMS actuator, a multilayer MEMS sensor or a multilayer MEMS generator.

17. MEMS device, comprising
a substrate, and
a first MEMS component as claimed in claim 12, wherein the passive layer of the MEMS component is deflectably disposed on the substrate.

18. MEMS device as claimed in claim 16, comprising
a second MEMS component as claimed in claim 12, wherein the first and second passive layers are a community, and the electrodes and ferroelectric layers of the first and second MEMS components are arranged in parallel.

* * * * *